US012698454B2

(12) United States Patent
Kamimura

(10) Patent No.: US 12,698,454 B2
(45) Date of Patent: Aug. 4, 2026

(54) METHOD FOR PRODUCING TREATMENT LIQUID

(71) Applicant: FUJIFILM Corporation, Tokyo (JP)

(72) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 771 days.

(21) Appl. No.: 18/147,961

(22) Filed: Dec. 29, 2022

(65) Prior Publication Data

US 2023/0143521 A1 May 11, 2023

Related U.S. Application Data

(63) Continuation of application No. PCT/JP2021/020446, filed on May 28, 2021.

(30) Foreign Application Priority Data

Jun. 30, 2020 (JP) ................................ 2020-112896
Jan. 8, 2021 (JP) ................................ 2021-002023
May 6, 2021 (JP) ................................ 2021-078661

(51) Int. Cl.
*C11D 3/36* (2006.01)
*B01D 69/08* (2006.01)
(Continued)

(52) U.S. Cl.
CPC .............. *C11D 3/361* (2013.01); *B01D 69/08* (2013.01); *B01D 71/261* (2022.08);
(Continued)

(58) Field of Classification Search
CPC .... B01D 69/08; B01D 71/261; B01D 71/262; B01D 71/34; B01D 71/36; B01D 71/66;
(Continued)

(56) References Cited

U.S. PATENT DOCUMENTS 4,915,839 A * 4/1990 Marinaccio ........ B01D 39/1623 210/500.38
9,360,758 B2 * 6/2016 Lo ............................ G03F 7/30
(Continued)

FOREIGN PATENT DOCUMENTS

JP 2005-239615 A 9/2005
JP 2014-526153 A 10/2014
(Continued)

OTHER PUBLICATIONS

Communication issued Nov. 11, 2024 in Taiwanese Application No. 110123210.

(Continued)

*Primary Examiner* — Binh X Tran
*Assistant Examiner* — Christopher Remavege
(74) *Attorney, Agent, or Firm* — Sughrue Mion, PLLC

(57) ABSTRACT

An object of the present invention is to provide a method for producing a treatment liquid, having excellent filterability. The method for producing a treatment liquid of an embodiment of the present invention is a method for producing a treatment liquid, the method including filtering an object to be purified including a surfactant, using a first filter having a first filter medium, to produce a treatment liquid for a semiconductor substrate, in which the first filter medium includes at least one selected from the group consisting of a nylon, a polyallyl sulfonic acid, a perfluoroalkoxy alkane which has been subjected to a hydrophilization treatment, a polytetrafluoroethylene which has been subjected to a hydrophilization treatment, a polyolefin which has been subjected to a hydrophilization treatment, and a polyvinylidene fluoride which has been subjected to a hydrophilization treatment, and the surfactant includes at least one selected from the group consisting of a nonionic surfactant including a group represented by Formula (1) and an anionic surfactant including a group represented by Formula (1).

$$(LO)_n \qquad \text{Formula (1)}$$

L represents an alkylene group, and n represents 3 to 55.

20 Claims, 1 Drawing Sheet

(51) Int. Cl.

| | |
|---|---|
| ***B01D 71/26*** | (2006.01) |
| ***B01D 71/34*** | (2006.01) |
| ***B01D 71/36*** | (2006.01) |
| ***B01D 71/66*** | (2006.01) |
| ***C11D 1/62*** | (2006.01) |
| ***C11D 1/72*** | (2006.01) |
| ***C11D 3/20*** | (2006.01) |
| ***C11D 3/28*** | (2006.01) |
| ***C11D 3/30*** | (2006.01) |
| ***C11D 3/33*** | (2006.01) |
| ***C11D 3/37*** | (2006.01) |
| ***C11D 3/39*** | (2006.01) |
| ***H10P 70/00*** | (2026.01) |

(52) U.S. Cl.

CPC ........... *B01D 71/262* (2022.08); *B01D 71/34* (2013.01); *B01D 71/36* (2013.01); *B01D 71/66* (2013.01); *C11D 1/62* (2013.01); *C11D 1/721* (2013.01); *C11D 3/2079* (2013.01); *C11D 3/2082* (2013.01); *C11D 3/2086* (2013.01); *C11D 3/28* (2013.01); *C11D 3/30* (2013.01); *C11D 3/33* (2013.01); *C11D 3/3765* (2013.01); *C11D 3/3942* (2013.01); *H10P 70/277* (2026.01); *C11D 2111/22* (2024.01)

(58) Field of Classification Search

CPC ........... C11D 1/002; C11D 1/06; C11D 1/345; C11D 1/62; C11D 1/72; C11D 1/721; C11D 11/0094; C11D 2111/22; C11D 3/2079; C11D 3/2082; C11D 3/2086; C11D 3/28; C11D 3/30; C11D 3/33; C11D 3/361; C11D 3/3765; C11D 3/3942; H01L 21/02074

See application file for complete search history.

(56) References Cited

U.S. PATENT DOCUMENTS

| | | | | |
|---|---|---|---|---|
| 9,457,322 | B2 * | 10/2016 | Choi | B01D 69/1216 |
| 10,429,738 | B2 * | 10/2019 | Nakata | B01D 67/00793 |
| 10,557,107 | B2 * | 2/2020 | Sun | C11D 3/30 |
| 11,666,864 | B2 * | 6/2023 | Shimizu | G03F 7/30 210/636 |
| 11,684,898 | B2 * | 6/2023 | Madhavaram | B01D 29/07 55/484 |
| 12,186,715 | B2 * | 1/2025 | Nakata | B01D 67/003 |
| 2005/0000901 | A1 * | 1/2005 | Campbell | B01J 20/28035 210/660 |
| 2005/0173341 | A1 * | 8/2005 | Salinaro | B01D 67/00113 210/636 |
| 2007/0131611 | A1 * | 6/2007 | Peng | B01D 67/0088 428/305.5 |
| 2007/0225188 | A1 * | 9/2007 | Wang | C11D 3/30 510/175 |
| 2013/0053291 | A1 | 2/2013 | Otake et al. | |
| 2014/0061114 | A1 * | 3/2014 | Ramirez | B01D 71/261 210/489 |
| 2015/0298069 | A1 * | 10/2015 | Bae | C08J 9/28 521/64 |
| 2016/0075971 | A1 * | 3/2016 | Liu | H01L 21/02074 510/175 |
| 2017/0028359 | A1 * | 2/2017 | Singh | B01D 67/0088 |
| 2017/0028361 | A1 * | 2/2017 | Sitterer | B29C 55/005 |
| 2018/0193805 | A1 * | 7/2018 | Ogura | H01L 21/304 |
| 2018/0251712 | A1 * | 9/2018 | Sun | C11D 3/0073 |
| 2019/0002802 | A1 * | 1/2019 | Daeschlein | C11D 3/0026 |
| 2019/0099720 | A1 * | 4/2019 | Schacht | B01D 65/025 |
| 2019/0382698 | A1 * | 12/2019 | Lee | C11D 7/3209 |
| 2020/0013821 | A1 | 1/2020 | Oota et al. | |
| 2020/0047133 | A1 * | 2/2020 | Mou | H01M 10/0562 |
| 2020/0147528 | A1 | 5/2020 | Shimizu et al. | |
| 2020/0368692 | A1 * | 11/2020 | Shimizu | B01D 71/261 |
| 2021/0005473 | A1 | 1/2021 | Kamimura et al. | |

FOREIGN PATENT DOCUMENTS

| | | | |
|---|---|---|---|
| JP | 2018-199109 | A | 12/2018 |
| TW | 201942348 | A | 11/2019 |
| WO | 2018/174147 | A1 | 9/2018 |
| WO | 2019/022174 | A1 | 1/2019 |

OTHER PUBLICATIONS

International Search Report dated Aug. 31, 2021 from the International Searching Authority in International Application No. PCT/JP2021/020446.

Written Opinion dated Aug. 31, 2021 from the International Searching Authority in International Application No. PCT/JP2021/020446.

International preliminary Report on Patentability with the translation of Written Opinion dated Dec. 13, 2022 from the International Bureau in International Application No. PCT/JP2021/020446.

Communication dated Jul. 1, 2025 in Taiwanese Application No. 110123210.

* cited by examiner

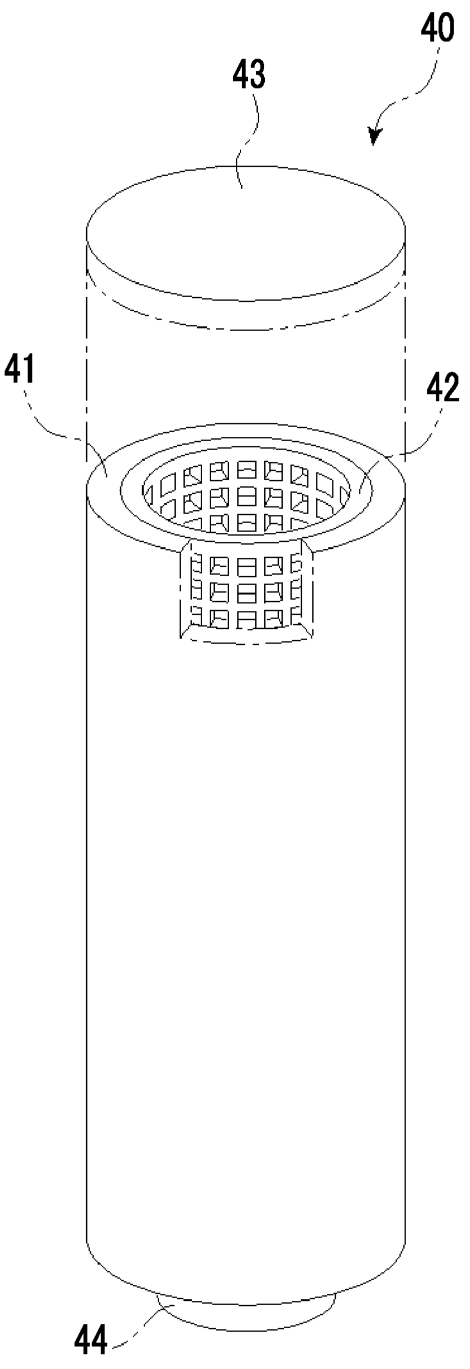
40
43
41
42
44

METHOD FOR PRODUCING TREATMENT LIQUID

CROSS-REFERENCE TO RELATED APPLICATIONS

This application is a Continuation of PCT International Application No. PCT/JP2021/020446 filed on May 28, 2021, which claims priority under 35 U.S.C. § 119(a) to Japanese Patent Application No. 2020-112896 filed on Jun. 30, 2020, Japanese Patent Application No. 2021-002023 filed on Jan. 8, 2021, and Japanese Patent Application No. 2021-078661 filed on May 6, 2021. The above applications are hereby expressly incorporated by reference, in their entirety, into the present application.

BACKGROUND OF THE INVENTION

1. Field of the Invention

The present invention relates to a method for producing a treatment liquid.

2. Description of the Related Art

In the manufacture of a semiconductor device, a treatment liquid for a semiconductor substrate is used as a pre-wet liquid, a resist liquid (resist composition), a developer, a rinsing liquid, a peeling liquid, a chemical liquid used for a chemical mechanical polishing (CMP) treatment, a cleaning liquid after CMP, and the like.

As an example of such a treatment liquid, a cleaning composition having predetermined characteristics after CMP is disclosed in JP2014-526153A. It is disclosed that the cleaning composition after CMP may include a surfactant (claim 2).

SUMMARY OF THE INVENTION

With an increase in performance of semiconductor devices in recent years, it is required that a content of impurities (coarse particles and the like) is reduced in a treatment liquid for a semiconductor substrate in some cases.

In order to obtain a treatment liquid in which a content of such impurities is reduced, a treatment liquid is produced by performing subjecting an object to be purified to purification such as filtration in some cases.

In a method for producing a treatment liquid, the treatment liquid obtained by subjecting an object to be purified to filtration, it is required that the filterability is excellent (that is, a treatment liquid having sufficiently reduced impurities can be obtained smoothly). However, as a result of studies conducted by the present inventors, it was confirmed that in a case where an object to be purified includes a predetermined surfactant, the filterability is insufficient in some cases.

Therefore, an object of the present invention is to provide a method for producing a treatment liquid, having excellent filterability.

The present inventors have found that the object can be accomplished by the following configurations.

[1] A method for producing a treatment liquid, comprising:

performing filtration of an object to be purified including a surfactant, using a first filter having a first filter medium, to produce a treatment liquid for a semiconductor substrate, in which the first filter medium includes at least one selected from the group consisting of a nylon, a polyallyl sulfonic acid, a perfluoroalkoxy alkane which has been subjected to a hydrophilization treatment, a polytetrafluoroethylene which has been subjected to a hydrophilization treatment, a polyolefin which has been subjected to a hydrophilization treatment, and a polyvinylidene fluoride which has been subjected to a hydrophilization treatment, and the surfactant includes at least one selected from the group consisting of a nonionic surfactant including a group represented by Formula (1) and an anionic surfactant including a group represented by Formula (1), $(LO)_n$ Formula (1)

in Formula (1), L represents an alkylene group, and n represents 3 to 55.

[2] The method for producing a treatment liquid as described in [1]

in which the treatment liquid is a treatment liquid to be applied to a semiconductor substrate which has been subjected to a chemical mechanical polishing treatment.

[3] The method for producing a treatment liquid as described in [1] or [2]

in which the object to be purified further includes an amine compound.

[4] The method for producing a treatment liquid as described in [3]

in which a mass ratio of a content of the amine compound to a content of the surfactant in the object to be purified is 2 to 1,000.

[5] The method for producing a treatment liquid as described in any one of [1] to [4]

in which the nonionic surfactant and the anionic surfactant include a group represented by Formula (2), $-Ph-O-(LO)_n-$ Formula (2)

in Formula (2), Ph represents a phenylene group, L represents an alkylene group, and n represents 3 to 55.

[6] The method for producing a treatment liquid as described in any one of [1] to [4]

in which in Formula (1), n represents 6 to 20.

[7] The method for producing a treatment liquid as described in any one of [1] to [6]

in which the object to be purified includes an aliphatic carboxylic acid-based chelating agent having 3 or more carbon atoms.

[8] The method for producing a treatment liquid as described in any one of [1] to [7]

in which a pH of the object to be purified is 8 to 12.

[9] The method for producing a treatment liquid as described in any one of [1] to [8]

in which the first filter medium is at least one selected from the group consisting of the nylon, the polyallyl sulfonic acid, the perfluoroalkoxy alkane which has been subjected to a hydrophilization treatment, and the polytetrafluoroethylene which has been subjected to a hydrophilization treatment.

[10] The method for producing a treatment liquid as described in any one of [1] to [9]

in which the first filter medium includes the polyallyl sulfonic acid.

[11] The method for producing a treatment liquid as described in any one of [1] to [10]

in which the filtration of the object to be purified is performed using the first filter and a second filter including a second filter medium, which is different from the first filter.

[12] The method for producing a treatment liquid as described in [11]

in which a pore diameter of the second filter medium is larger than a pore diameter of the first filter medium, and the object to be purified is passed through the second filter and the first filter in this order to perform the filtration of the object to be purified.

[13] The method for producing a treatment liquid as described in [12]

in which a ratio of the pore diameter of the second filter medium to the pore diameter of the first filter medium is 2 to 500.

[14] The method for producing a treatment liquid as described in any one of [1] to [13]

in which a filtration pressure for the filtration of the object to be purified, which is performed using the first filter, is 0.4 MPa or less.

[15] The method for producing a treatment liquid as described in any one of [1] to [14]

in which a filtration pressure for the filtration of the object to be purified, which is performed using the first filter, is 0.05 MPa or more.

According to the present invention, it is possible to provide a method for producing a treatment liquid, having excellent filterability.

BRIEF DESCRIPTION OF THE DRAWINGS

FIG. 1 is a partial cutaway perspective view of a typical first filter.

DESCRIPTION OF THE PREFERRED EMBODIMENTS

Hereinafter, an example of a form for carrying out the present invention will be described.

In the present specification, a numerical value range expressed using "to" means a range that includes the preceding and succeeding numerical values of "to" as the lower limit value and the upper limit value, respectively.

In the present specification, in a case where two or more kinds of a certain component are present, the "content" of the component means a total content of the two or more kinds of the component.

In the present specification, "ppm" means "parts-per-million ($10^{-6}$)", and "ppb" means "parts-per-billion ($10^{-9}$)".

The compounds described in the present specification may include isomers (compounds having the same number of atoms but having different structures), optical isomers, and isotopes thereof unless otherwise restricted. In addition, only one kind or a plurality of kinds of the isomers and the isotopes may be included.

In the present specification, psi means a pound-force per square inch; 1 psi=6,894.76 Pa.

[Method for Producing Treatment Liquid]

The method for producing a treatment liquid according to an embodiment of the present invention (hereinafter also simply referred to as a "production method") is a method for producing a treatment liquid, in which filtration of an object to be purified including a surfactant is performed to produce a treatment liquid for a semiconductor substrate, in which the first filter medium includes at least one selected from the group consisting of a nylon, a polyallyl sulfonic acid, a perfluoroalkoxy alkane which has been subjected to a hydrophilization treatment, a polytetrafluoroethylene which has been subjected to a hydrophilization treatment, a polyolefin which has been subjected to a hydrophilization treatment, and a polyvinylidene fluoride which has been subjected to a hydrophilization treatment, and in which the surfactant includes at least one selected from the group consisting of a nonionic surfactant including a group represented by Formula (1) and an anionic surfactant including a group represented by Formula (1).

(Formula (1) $(LO)_n$: L is an Alkylene Group, and n is 3 to 55)

The mechanism by which the objects of the present invention are accomplished through the configuration is not necessarily clear, but is presumed by the present inventors to be as follows.

That is, first, it is presumed that in a case where the object to be purified includes a predetermined surfactant, bubbles due to the presence of the surfactant are generated during filtration to cause the filter medium of the filter to be clogged with bubbles, leading to a deterioration of the filterability in that the filtration flow rate decreases and/or the filtration cannot be carried out. Therefore, it is presumed that in a case of using a filter having a predetermined filter medium having high hydrophilicity, impurities (coarse particles and the like) can be sufficiently removed, and bubbles are less likely to be generated during filtration, or even in a case where bubbles are generated, the bubbles are less likely to cause clogging, leading to an improvement of the filterability.

[Object to Be Purified]

The components included in the object to be purified used in the production method of the embodiment of the present invention will be described.

<Surfactant>

The object to be purified includes at least one (hereinafter also referred to as a "specific surfactant") selected from the group consisting of a nonionic surfactant including a group represented by Formula (1) and an anionic surfactant including a group represented by Formula (1).

The specific surfactant may be used alone or two or more kinds of the specific surfactants may be used.

The content of the specific surfactant is preferably 0.00001% to 10% by mass, more preferably 0.0001% to 3% by mass, and still more preferably 0.002% to 1.5% by mass, with respect to the total mass of the object to be purified.

In addition, the content of the specific surfactant is preferably 0.00001% to 50% by mass, more preferably 0.005% to 40% by mass, and still more preferably 0.03% to 35% by mass, with respect to the total mass of the components excluding the solvent of the object to be purified.

Furthermore, "the total mass of the components excluding the solvent of the object to be purified" means a total content of all the components included in the object to be purified other than water and the organic solvent.

(Nonionic Surfactant Including Group Represented by Formula (1))

The nonionic surfactant which is the specific surfactant includes a group represented by Formula (1).

$$(LO)_n \qquad \text{Formula (1)}$$

In Formula (1), L represents an alkylene group. The alkylene group may be linear or branched. The alkylene group preferably has 1 to 10 carbon atoms, more preferably has 2 or 3 carbon atoms, and still more preferably has 2 carbon atoms. L's present in plural number in Formula (1) may be the same as or different from each other.

In Formula (1), n represents 3 to 55, preferably 3 to 30, and more preferably 6 to 20.

Furthermore, n represents an integer value.

In other words, the group represented by Formula (1) is a polyoxyalkylene group (for example, a polyoxyethylene group, a polyoxypropylene group, and a polyoxyethylene polyoxypropylene group) having a repetition number n.

Among those, the group represented by Formula (1) is preferably a polyoxyethylene group in which n is 3 to 30, and more preferably a polyoxyethylene group in which n is 6 to 20.

The group bonded to a terminal on the O side of the group represented by Formula (1) (that is, the group bonded to the right side of the group represented by Formula (1)) is preferably a group other than "*1-L-O-*2". L in "*1-L-O-*2" is the same as L in Formula (1), *1 is a bonding position with O present at a terminal of the group represented by Formula (1), and *2 is a bonding position on the opposite side to *1.

The group bonded to a terminal on the O side of the group represented by Formula (1) (that is, the group bonded to the left side of the group represented by Formula (1)) is preferably a hydrogen atom, an alkyl group, or an aromatic ring group. The alkyl group may be linear or branched, and preferably has 1 to 30 carbon atoms. The aromatic ring group may have a substituent, and examples of the substituent include a hydrocarbon group (an alkyl group and the like, preferably having 1 to 30 carbon atoms).

The group bonded to a terminal on the L side of the group represented by Formula (1) is preferably a group other than "*3-O-L-O-*3". L in "*3-O-L-O-*3" is the same as L in Formula (1), and *3 is a bonding position.

The group bonded to a terminal on the L side of the group represented by Formula (1) is preferably a hydroxyl group, an alkoxy group, or a group represented by an aromatic ring —O—. The alkoxy group may be linear or branched, and preferably has 1 to 30 carbon atoms. The aromatic ring may have a substituent, and examples of the substituent include a hydrocarbon group (an alkyl group and the like, preferably having 1 to 30 carbon atoms).

The nonionic surfactant which is the specific surfactant preferably includes a group represented by Formula (2).

$$\text{-Ph-O-(LO)}_n\text{-} \qquad \text{Formula (2)}$$

In Formula (2), Ph represents a phenylene group. L represents an alkylene group. n represents 3 to 55.

In Formula (2), "$(LO)_n$" is the same as in the group represented by Formula (1).

In the group represented by Formula (2), the group bonded at a terminal on the Ph side is preferably a hydrogen atom or an alkyl group. The alkyl group may be linear or branched, and preferably has 1 to 30 carbon atoms, and more preferably has 6 to 22 carbon atoms.

Examples of a structure of the nonionic surfactant which is the specific surfactant include a compound represented by Formula (N).

$$\text{R}^{NI}\text{-L}^{NI}\text{-(LO)}_n\text{-H} \qquad \text{Formula (N)}$$

In Formula (N), "$(LO)_n$" is the same as in the group represented by Formula (1).

In Formula (N), $R^{NI}$ represents an alkyl group, an allyl group, an aryl group, or a group formed by combination of these groups (an alkylaryl group and the like). These groups may have one or more substituents. The alkyl group may be linear or branched. The alkyl group preferably has 1 to 30 carbon atoms, and more preferably 6 to 22 carbon atoms. One or more of the ethylene groups in the alkyl group may be substituted with a vinylene group. The aryl group preferably has 6 to 12 carbon atoms. The allyl group preferably has 2 or more carbon atoms, and more preferably has 2 to 22 carbon atoms.

In Formula (N), $L^{NI}$ represents a single bond or a divalent linking group. As the divalent linking group, —O—, —CO—, —NR$^{11}$—, —S—, —SO$_2$—, —PO(OR$^{12}$)—, an alkylene group, an arylene group, or a group formed by combination of these groups is preferable. Here, $R^{11}$ represents a hydrogen atom, an alkyl group, an aryl group, or an aralkyl group. $R^{12}$ represents an alkyl group, an aryl group, or an aralkyl group.

Examples of the nonionic surfactant which is the specific surfactant include polyoxyalkylene alkyl ethers (for example, a polyoxyethylene lauryl ether and a polyoxyethylene stearyl ether), polyoxyalkylene alkenyl ethers (for example, a polyoxyethylene oleyl ether), polyoxyethylene alkylphenyl ethers (for example, a polyoxyethylene nonylphenyl ether), polyoxyalkylene glycol (for example, polyoxypropylene polyoxyethylene glycol), polyoxyalkylene monoalkylates (monoalkyl fatty acid ester polyoxyalkylene) (for example, polyoxyethylene monoalkylates such as polyoxyethylene monostearate and polyoxyethylene monooleate), polyoxyalkylene dialkylates (dialkyl fatty acid ester polyoxyalkylene) (for example, polyoxyethylene dialkylates such as polyoxyethylene distearate and polyoxyethylene diolate), bispolyoxyalkylene alkylamides (for example, bispolyoxyethylene stearylamide), a polyoxyethylene sorbitan fatty acid ester, a polyoxyethylene alkylamine, an oxyethylene oxypropylene block copolymer, and an acetylene-based polyoxyethylene oxide. It should be noted that all of these nonionic surfactants include the group represented by Formula (1).

Among those, the nonionic surfactant which is the specific surfactant is preferably the polyoxyethylene alkylphenyl ether.

The alkyl group moiety in the polyoxyethylene alkylphenyl ether may be linear or branched, and is preferably branched. The number of carbon atoms in the alkyl group moiety is preferably 5 or more, and more preferably 8 or more. The upper limit of the number of carbon atoms is, for example, 20 or less.

The number of repeating units of the polyoxyethylene group moiety in the above-mentioned polyoxyethylene alkylphenyl ether is preferably 5 or more, and more preferably 8 or more. The upper limit of the number of repeating units is, for example, 20 or less.

(Anionic Surfactant Including Group Represented by Formula (1))

The anionic surfactant which is the specific surfactant includes a group represented by Formula (1).

The group represented by Formula (1) in the anionic surfactant which is the specific surfactant is the same as the group represented by Formula (1) described in the description of the above-mentioned nonionic surfactant.

In addition, it is also preferable that the anionic surfactant includes a group represented by Formula (2). The group represented by Formula (2) in the anionic surfactant is the same as the group represented by Formula (2) described in the description of the above-mentioned nonionic surfactant.

Examples of a structure of the anionic surfactant which is the specific surfactant include a compound represented by Formula (A).

$$R^{NA}\text{-}L^{NA1}\text{-}(LO)_n\text{-}L^{NA2}\text{-}Q^{NA} \quad \text{Formula (A)}$$

In Formula (A), "$(LO)_n$" is the same as in the group represented by Formula (1).

In Formula (A), $R^{NA}$ represents an alkyl group, an aryl group, or a group formed by combination of these groups (an alkylaryl group and the like). These groups may have one or more substituents. Examples of the substituent include halogen atoms such as a fluorine atom, and a hydroxyl group. The alkyl group may be linear or branched. The alkyl group preferably has 1 to 30 carbon atoms, and more preferably 6 to 22 carbon atoms. The aryl group preferably has 6 to 12 carbon atoms. One or more of the ethylene groups in the alkyl group may be substituted with a vinylene group.

In Formula (A), $L^{NA1}$ and $L^{NA2}$ each independently represent a single bond or a divalent linking group. As the divalent linking group, —O—, —CO—, —$NR^{11}$—, —S—, —$SO_2$—, —$PO(OR^{12})$—, an alkylene group (preferably having 1 to 6 carbon atoms), an arylene group (preferably having 6 to 12 carbon atoms), or a group formed by combination of these groups is preferable. Here, $R^{11}$ represents a hydrogen atom, an alkyl group, an aryl group, or an aralkyl group. $R^{12}$ represents an alkyl group, an aryl group, or an aralkyl group. The alkylene group and the arylene group may each independently have a substituent, and may have, for example, one or more anionic groups as the substituent.

Among those, $L^{NA1}$ is preferably —O—. $L^{NA2}$ is preferably a single bond or an alkylene group.

In Formula (A), $Q^{NA}$ represents an anionic group. Examples of the anionic group include groups represented by —COOM, —$OSO_3M$, —$P(=O)(OR^{NA2})OM$, and —$SO_3M$. M represents a hydrogen atom or a counter cation. Examples of the counter cation include alkali metal ions (such as lithium, sodium, and potassium). $R^{NA2}$ represents an alkyl group having 1 to 3 carbon atoms, a hydrogen atom, a counter cation, or a group represented by "$R^{NA}$-$L^{NA1}$-$(LO)_n$-$L^{NA2}$-". $R^{NA}$, $L^{NA1}$, $(LO)_n$, and $L^{NA2}$ in the group represented by "$R^{NA}$-$L^{NA1}$-$(LO)_n$-$L^{NA2}$-" are each as mentioned above.

Examples of the anionic surfactant include phosphoric acid ester-based surfactants having a phosphoric acid ester group, phosphonic acid-based surfactants having a phosphonic acid group, sulfonic acid-based surfactants having a sulfo group, carboxylic acid-based surfactants having a carboxy group, and sulfuric acid ester-based surfactants having a sulfuric acid ester group, respectively, as a hydrophilic group (acid group). A compound which corresponds to these anionic surfactants and includes the group represented by Formula (1) can also be used as the specific surfactant.

Phosphoric Acid Ester-Based Surfactant

Examples of the phosphoric acid ester-based surfactant include a polyoxyalkylene alkyl ether phosphoric acid ester and a salt thereof. The polyoxyalkylene alkyl ether phosphoric acid ester usually includes both a monoester and a diester, but the monoester or the diester can be used alone.

Examples of the salt of the phosphoric acid ester-based surfactant include a sodium salt, a potassium salt, an ammonium salt, and an organic amine salt.

The monovalent alkyl group contained in the polyoxyalkylene alkyl ether phosphoric acid ester is not particularly limited, but is preferably an alkyl group having 2 to 24 carbon atoms, more preferably an alkyl group having 6 to 18 carbon atoms, and still more preferably an alkyl group having 12 to 18 carbon atoms.

The divalent alkylene group contained in the polyoxyalkylene alkyl ether phosphoric acid ester is not particularly limited, but is preferably an alkylene group having 2 to 6 carbon atoms, and more preferably an ethylene group or a 1,2-propanediyl group. In addition, the number of repetitions of the oxyalkylene group in the polyoxyalkylene ether phosphoric acid ester is preferably 3 to 12, and more preferably 3 to 6.

As the phosphoric acid ester-based surfactant, a polyoxyethylene octyl ether phosphoric acid ester, a polyoxyethylene lauryl ether phosphoric acid ester, a polyoxyethylene tridecyl ether phosphoric acid ester, or a polyoxyethylene myristyl ether phosphoric acid ester is preferable, a lauryl phosphoric acid ester, a tridecyl phosphoric acid ester, a myristyl phosphoric acid ester, a cetyl phosphoric acid ester, a stearyl phosphoric acid ester, or a polyoxyethylene myristyl ether phosphoric acid ester is more preferable, and the lauryl phosphoric acid ester, the cetyl phosphoric acid ester, the stearyl phosphoric acid ester, or the polyoxyethylene myristyl ether phosphoric acid ester is still more preferable.

As the phosphoric acid ester-based surfactant, the compounds satisfying the requirements as a specific surfactant among the compounds described in paragraphs [0012] to [0019] of JP2011-040502A, the contents of which are incorporated herein by reference, can also be used.

Sulfonic Acid-Based Surfactant

Examples of the sulfonic acid-based surfactant include a polyoxyalkylene alkyl ether sulfonic acid and a salt thereof.

The monovalent alkyl group contained in the sulfonic acid-based surfactant is not particularly limited, but is preferably an alkyl group having 2 to 24 carbon atoms, and more preferably an alkyl group having 6 to 18 carbon atoms.

Moreover, the divalent alkylene group contained in the polyoxyalkylene alkyl ether sulfonic acid is not particularly limited, but is preferably an ethylene group or a 1,2-propanediyl group. In addition, the number of repetitions of the oxyalkylene group in the polyoxyalkylene alkyl ether sulfonic acid is preferably 3 to 12, and more preferably 3 to 6.

Carboxylic Acid-Based Surfactant

Examples of the carboxylic acid-based surfactant include a polyoxyalkylene alkyl ether carboxylic acid and a salt thereof.

The monovalent alkyl group contained in the above-mentioned carboxylic acid-based surfactant is not particularly limited, but is preferably an alkyl group having 7 to 25 carbon atoms, and more preferably an alkyl group having 11 to 17 carbon atoms.

The divalent alkylene group contained in the polyoxyalkylene alkyl ether carboxylic acid is not particularly limited, but is preferably an ethylene group or a 1,2-propanediyl group. In addition, the number of repetitions of the oxyalkylene group in the polyoxyalkylene alkyl ether carboxylic acid is preferably 3 to 12, and more preferably 3 to 6.

Specific examples of the carboxylic acid-based surfactant include polyoxyethylene lauryl ether acetic acid and polyoxyethylene tridecyl ether acetic acid.

Sulfuric Acid Ester-Based Surfactant

Examples of the sulfuric acid ester-based surfactant include a polyoxyalkylene alkyl ether sulfuric acid ester and a salt thereof.

The monovalent alkyl group contained in the polyoxyalkylene alkyl ether sulfuric acid ester is not particularly limited, but is preferably an alkyl group having 2 to 24 carbon atoms, and more preferably an alkyl group having 6 to 18 carbon atoms.

The divalent alkylene group contained in the polyoxyalkylene alkyl ether sulfuric acid ester is not particularly limited, but is preferably an ethylene group or a 1,2-propanediyl group. In addition, the number of repetitions of the oxyalkylene group in the polyoxyalkylene alkyl ether sulfuric acid ester is preferably 1 to 12, and more preferably 1 to 6.

Specific examples of the sulfuric acid ester-based surfactant include polyoxyethylene lauryl ether sulfuric acid.

(Physical Properties of Surfactant)

The specific surfactant is preferably a surfactant in which a surface tension of an aqueous solution of the specific surfactant with a content of the specific surfactant of 1% by mass with respect to the total mass is 10 to 60 mN/m, more preferably a surfactant in which the surface tension is 10 to 50 mN/m, and still more preferably a surfactant in which the surface tension is 15 to 45 mN/m.

<Amine Compound>

It is also preferable that the object to be purified includes an amine compound.

The amine compound is a compound different from the specific surfactant.

The amine compound is at least one selected from the group consisting of a primary amine having a primary amino group ($—NH_2$) in the molecule, a secondary amine having a secondary amino group (>NH) in the molecule, a tertiary amine having a tertiary amino group (>N—) in the molecule, and salts thereof.

Examples of the amine compound include an amino alcohol, an amine compound having a cyclic structure, and a monoamine or polyamine compound other than these compounds.

In addition, examples of salts of the primary amine, the secondary amine, and the tertiary amine include a salt with an inorganic acid in which at least one non-metal selected from the group consisting of Cl, S, N, and P is bonded to hydrogen, and a hydrochloride, a sulfate, or a nitrate is preferable.

(Amino Alcohol)

The amine compound preferably includes an amino alcohol from the viewpoint that the defect inhibition performance is more excellent. The amino alcohol is a compound which further has at least one hydroxylalkyl group in the molecule among the amine compounds.

The amino alcohol may have any of primary to tertiary amino groups, but preferably has the primary amino group.

In addition, the amino alcohol preferably has a quaternary carbon atom at the α-position of an amino group (a primary amino group, a secondary amino group, or a tertiary amino group). That is, it is preferable that the carbon atom bonded to the amino group is not bonded to a hydrogen atom but is bonded to three organic groups.

Examples of the amino alcohol include monoethanolamine (MEA), 2-amino-2-methyl-1-propanol (AMP), diethanolamine (DEA), triethanolamine (TEA), diethylene glycolamine (DEGA), trishydroxymethylaminomethane (Tris), 2-(methylamino)-2-methyl-1-propanol (N-MAMP), dimethyl bis(2-hydroxyethyl) ammonium hydroxide (AH212), 2-(2-aminoethylamino) ethanol, and N,N-dimethyl-2-amino-2-methyl-1-propanol (DMAMP).

Among those, AMP, N-MAMP, MEA, DEA, Tris, or DEGA is preferable, and AMP, MEA, DEA, or DEGA is more preferable.

In a case where the object to be purified includes an amino alcohol as the amine compound, one kind of amino alcohol may be included alone or two or more kinds of amino alcohols may be included.

(Amine Compound Having Cyclic Structure)

The cyclic structure of the amine compound having a cyclic structure is not particularly limited, and examples thereof include a heterocyclic ring (nitrogen-containing heterocyclic ring) in which at least one of the atoms constituting the ring is a nitrogen atom.

Examples of the amine compound having a cyclic structure include an azole compound, a pyridine compound, a pyrazine compound, a pyrimidine compound, a piperazine compound, and a cyclic amidine compound.

The azole compound is a compound having a hetero-5-membered ring that includes at least one nitrogen atom and has aromaticity. The number of nitrogen atoms included in the hetero-5-membered ring of the azole compound is not particularly limited, and is preferably 2 to 4, more preferably 3 or 4.

Examples of the azole compound include an imidazole compound, a pyrazole compound, a thiazole compound, a triazole compound, and a tetrazole compound.

As the azole compound, the triazole compound or the tetrazole compound is preferable, and 1,2,4-triazole, 5-aminotetrazole, or 1H-tetrazole is more preferable.

The pyridine compound is a compound having a hetero-6-membered ring (pyridine ring) that includes one nitrogen atom and has aromaticity.

Specific examples of the pyridine compound include pyridine, 3-aminopyridine, 4-aminopyridine, 3-hydroxypyridine, 4-hydroxypyridine, 2-acetamidopyridine, 2-cyanopyridine, 2-carboxypyridine, and 4-carboxypyridine.

The pyrazine compound is a compound having aromaticity and having a hetero-6-membered ring (pyrazine ring) including two nitrogen atoms located at the para positions, and the pyrimidine compound is a compound having aromaticity and having a hetero-6-membered ring (pyrimidine ring) including two nitrogen atoms located at the meta positions.

Examples of the pyrazine compound include pyrazine, 2-methylpyrazine, 2,5-dimethylpyrazine, 2,3,5-trimethylpyrazine, 2,3,5,6-tetramethylpyrazine, 2-ethyl-3-methylpyrazine, and 2-amino-5-methylpyrazine, and pyrazine is preferable.

Examples of the pyrimidine compound include pyrimidine, 2-methylpyrimidine, 2-aminopyrimidine, and 4,6-dimethylpyrimidine, and 2-aminopyrimidine is preferable.

The piperazine compound is a compound having a hetero-6-membered ring (piperazine ring) in which the opposite CH group of a cyclohexane ring is substituted with a nitrogen atom. The piperazine compound is preferable from the viewpoint of the effect of the present invention is more excellent.

The piperazine compound may have a substituent on the piperazine ring. Examples of such a substituent include a hydroxy group, an alkyl group having 1 to 4 carbon atoms, which may have a hydroxy group, and an aryl group having 6 to 10 carbon atoms.

Examples of the piperazine compound include piperazine, 1-methylpiperazine, 1-ethylpiperazine, 1-propylpiperazine, 1-butylpiperazine, 2-methylpiperazine, 1,4-dimethylpiperazine, 2,5-dimethylpiperazine, 2,6-dimethylpiperazine, 1-phenylpiperazine, 2-hydroxypiperazine, 2-hydroxymethylpiperazine, 1-(2-hydroxyethyl)piperazine (HEP), N-(2-aminoethyl)piperazine (AEP), 1,4-bis(2-hydroxyethyl)piperazine (BHEP), 1,4-bis(2-aminoethyl)piperazine (BAEP), and 1,4-bis(3-aminopropyl)piperazine (BAPP), and piperazine; and 1-methylpiperazine, 2-methylpiperazine, HEP, AEP, BHEP, BAEP, or BAPP is preferable, and HEP, AEP, BHEP, BAEP, or BAPP is more preferable.

The cyclic amidine compound is a compound having a heterocyclic ring including an amidine structure (>N—C═N—) in the ring.

The number of ring members of the heterocyclic ring contained in the cyclic amidine compound is not particularly limited, but is preferably 5 or 6, and more preferably 6.

Examples of the cyclic amidine compound include diazabicycloundecene (1,8-diazabicyclo[5.4.0]undec-7-ene: DBU), diazabicyclononene (1,5-diazabicyclo[4.3.0]non-5-ene: DBN), 3,4,6,7,8,9,10,11-octahydro-2H-pyrimid[1.2-a]azocine, 3,4,6,7,8,9-hexahydro-2H-pyrido[1,2-a]pyrimidine, 2,5,6,7-tetrahydro-3H-pyrrolo[1.2-a]imidazole, 3-ethyl-2,3,4,6,7,8,9,10-octahydropyrimid[1.2-a]azepine, and creatinine; and DBU or DBN is preferable.

Other examples of the amine compound having a cyclic structure include a compound having a non-aromatic, hetero-5-membered ring such as 1,3-dimethyl-2-imidazolidinone and imidazolidinethione, and a compound having a 7-membered ring, including a nitrogen atom.

As the amine compound having a cyclic structure, a triazole compound, a tetrazole compound, a piperazine compound, or a cyclic amidin compound is preferable, and the piperazine compound is more preferable.

(Monoamine Compound)

The monoamine compound other than the amino alcohol and the amine compound having a cyclic structure is not particularly limited, and examples thereof include a compound represented by Formula (a) (hereinafter also referred to as a "compound (a)").

$$NH_xR_{(3-x)} \quad (a)$$

In the formula, R represents an alkyl group having 1 to 3 carbon atoms, and x represents an integer of 0 to 2.

Examples of the alkyl group having 1 to 3 carbon atoms include a methyl group, an ethyl group, an n-propyl group, and an isopropyl group; and the ethyl group or the n-propyl group is preferable.

Examples of the compound (a) include methylamine, ethylamine, propylamine, dimethylamine, diethylamine, trimethylamine, and triethylamine; and ethylamine, propylamine, diethylamine, or triethylamine is preferable.

In a case where the object to be purified includes two or more kinds of amine compounds and at least one of the two or more kinds of amine compounds is the compound (a), a treatment liquid thus obtained has defect inhibition performance for a metal film, which is thus preferable. Although not constrained by theory, it is presumed that the compound (a) is a small molecule, and has a relatively high water solubility and an excellent coordination rate with respect to a metal (for example, Co, W, and Cu).

Examples of the monoamine compound other than the compound (a) include benzylamine, diethylamine, n-butylamine, 3-methoxypropylamine, tert-butylamine, n-hexylamine, cyclohexylamine, n-octylamine, 2-ethylhexylamine, and 4-(2-aminoethyl) morpholine (AEM).

(Polyamine Compound)

Examples of the polyamine compound other than the amino alcohol and the amine compound having a cyclic structure include alkylenediamines such as ethylenediamine (EDA), 1,3-propanediamine (PDA), 1,2-propanediamine, 1,3-butanediamine, and 1,4-butanediamine, and polyalkylpolyamines such as diethylenetriamine (DETA), triethylenetetramine (TETA), and tetraethylenepentamine.

In addition, as the amine compound, the amine compounds described in paragraphs to of WO2013/162020A, the contents of which are incorporated herein by reference, can be used.

From the viewpoint that the defect inhibition performance is excellent, it is also preferable that the amine compound further has one or more hydrophilic groups in addition to one primary to tertiary amino group. Examples of the hydrophilic group include primary to tertiary amino groups, a hydroxy group, and a carboxy group; and the primary to tertiary amino groups or the hydroxy group is preferable.

Examples of such an amine compound include a polyamine compound having two or more primary to tertiary amino groups, an amino alcohol having one or more primary to tertiary amino groups and one or more hydroxy groups, and a compound having two or more hydrophilic groups among the amine compounds having a cyclic structure.

The upper limit of the total number of the hydrophilic groups contained in the amine compound is not particularly limited, but is preferably 5 or less, and more preferably 4 or less.

In addition, from the viewpoint that in a case of diluting the obtained treatment liquid with water or the like, a fluctuation in the pH of the treatment liquid can be suppressed and a variation in the defect inhibition performance can be suppressed, it is preferable that an amine compound having a first acid dissociation constant (hereinafter also described as a "pKa1") of a conjugate acid of the object to be purified of 7.0 or more (more preferably 7.5 to 13.0, still more preferably 8.0 to 12.0, and particularly preferably 8.5 to 11.0) is included.

Furthermore, in the present specification, the first acid dissociation constant (pKa1) is a value determined by using SC-Database (The IUPAC Stability Constants Database) (http://acadsoft.co.uk/scdbase/SCDB_software/scdb_download.htm).

As the amine compound included in the object to be purified, monoethanolamine (MEA) (pKa1 of conjugate acid: 9.55) and 2-amino-2-methyl-1-propanol (AMP) (pKa1 of conjugate acid: 9.72), 2-(methylamino)-2-methyl-1-propanol (N-MAMP) (pKa1 of conjugate acid: 9.70), diethanolamine (DEA) (pKa1 of conjugate acid: 8.88), diethylene glycolamine (DEGA) (pKa1 of conjugate acid: 9.02), trishydroxymethylaminomethane (Tris) (pKa1 of conjugate acid: 8.30), ethylenediamine (EDA) (pKa1 of conjugate acid: 10.7), 1,3-propanediamine (PDA) (pKa1 of conjugate acid: 10.94), diethylenetriamine (DETA) (pKa1 of conjugate acid: 10.45), triethylenetetramine (TETA) (pKa1 of conjugate acid: 10.6), N-(2-aminoethyl)piperazine (AEP) (pKa1 of conjugate acid: 10.5), 1,4-bis(2-hydroxyethyl)piperazine (BHEP) (pKa1 of conjugate acid: 9.6), 1,4-bis(2-aminoethyl)piperazine (BAEP) (pKa1 of conjugate acid: 10.6), 1,4-bis(3-aminopropyl)piperazine (BAPP) (pKa1 of conjugate acid: 10.3), bis(aminopropyl)ethylenediamine (BAPEDA) (pKa1 of conjugate acid: 10.5), ethylamine (pKa1 of conjugate acid: 10.6), triethylamine (pKa1 of conjugate acid: 10.75), or propylamine (pKa1 of conjugate acid: 10.6) is preferable.

Among those, MEA, AMP, DEGA, PDA, DETA, TETA, AEP, BHEP, BAEP, BAPP, or BAPEDA is preferable from the viewpoint that the defect inhibition performance is more excellent.

The object to be purified may include one kind of amine compound alone, or may include two or more kinds of amine compounds.

A content of the amine compound in the object to be purified according to the present invention is preferably 0.01% to 20% by mass, more preferably 0.1% to 10% by mass, and still more preferably 2% to 4% by mass, with respect to the total mass of the object to be purified.

In addition, the content of the amine compound is preferably 1% to 99% by mass, more preferably 15% to 98% by mass, and still more preferably 35% to 97% by mass, with respect to the total mass of the components excluding the solvent of the object to be purified.

<Chelating Agent>

It is also preferable that the object to be purified includes a chelating agent as a component different from the above-mentioned components.

The chelating agent is a compound having a function of chelating with a metal which may be present on the semiconductor substrate. Among those, a compound having two or more functional groups (coordinating groups) which are coordinately bonded with a metal ion in one molecule is preferable.

Examples of the coordinating group included in the chelating agent include an acid group and a cationic group. Examples of the acid group include a carboxy group, a phosphonic acid group, a sulfo group, and a phenolic hydroxy group. Examples of the cationic group include an amino group.

The chelating agent preferably has an acid group, and more preferably has at least one coordinating group selected from a carboxy group or a phosphonic acid group, as the coordinating group.

Examples of the chelating agent include an organic chelating agent and an inorganic chelating agent.

The organic chelating agent is a chelating agent consisting of an organic compound, and examples thereof include a carboxylic acid-based chelating agent having a carboxy group as a coordinating group and a phosphonic acid-based chelating agent having a phosphonic acid group as a coordinating group.

Examples of the inorganic chelating agent include a fused phosphoric acid and a salt thereof.

As the chelating agent, the organic chelating agent is preferable, the organic chelating agent having at least one coordinating group selected from a carboxy group and a phosphonic acid group is more preferable, and the organic chelating agent having only a carboxy group as a coordinating group is still more preferable.

It is also preferable that the chelating agent has a low molecular weight. Specifically, the molecular weight of the chelating agent is preferably 600 or less, more preferably 450 or less, and still more preferably 300 or less. The lower limit is, for example, preferably 90 or more, and more preferably 100 or more.

In addition, in a case where the chelating agent is an organic chelating agent, the number of carbon atoms of the chelating agent is preferably 15 or less, more preferably 12 or less, and still more preferably 8 or less. The lower limit of the number of carbon atoms is, for example, preferably 2 or more, and more preferably 3 or more.

(Carboxylic Acid-Based Chelating Agent)

The carboxylic acid-based chelating agent is a chelating agent having a carboxy group as a coordinating group in the molecule, and examples thereof include an aminopolycarboxylic acid-based chelating agent, an amino acid-based chelating agent, a hydroxycarboxylic acid-based chelating agent, an aliphatic carboxylic acid-based chelating agent, and an aromatic carboxylic acid-based chelating agent; and an aliphatic carboxylic acid-based chelating agent having 3 or more carbon atoms is preferable.

The number of carboxy groups contained in the carboxylic acid-based chelating agent is preferably 2 or more, more preferably 2 to 10, and still more preferably 2.

Examples of the aminopolycarboxylic acid-based chelating agent include butylenediaminetetraacetic acid, diethylenetriaminepentaacetic acid (DTPA), ethylenediaminetetrapropionic acid, triethylenetetraaminehexaacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid, ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanoltetraacetic acid, (hydroxyethyl)ethylenediaminetriacetic acid, and iminodiacetic acid (IDA).

Among those, diethylenetriamine pentaacetic acid (DTPA), ethylenediaminetetraacetic acid (EDTA), trans-1,2-diaminocyclohexanetetraacetic acid, or iminodiacetic acid (IDA) is preferable.

Examples of the amino acid-based chelating agent include glycine, serine, α-alanine (2-aminopropionic acid), β-alanine (3-aminopropionic acid), lysine, leucine, isoleucine, cystine, cysteine, ethionine, threonine, tryptophan, tyrosine, valine, histidine, a histidine derivative, asparagine, aspartic acid, glutamine, glutamic acid, arginine, proline, methionine, phenylalanine, the compounds described in paragraphs [0021] to [0023] of JP2016-086094A, and salts thereof. Incidentally, as the histidine derivative, the compounds described in JP2015-165561A, JP2015-165562A, and the like, the contents of which are incorporated herein by reference, can be used. In addition, examples of the salt include alkali metal salts such as a sodium salt and a potassium salt, an ammonium salt, a carbonate, and acetate.

From the viewpoint that the corrosion prevention performance for a metal film is excellent, a sulfur-containing amino acid that contains a sulfur atom is preferable as the amino acid-based chelating agent. Examples of the sulfur-containing amino acid include cystine, cysteine, ethionine, and methionine. Among those, cystine or cysteine is preferable.

Examples of the hydroxycarboxylic acid-based chelating agent include malic acid, citric acid, glycolic acid, gluconic acid, heptonic acid, tartaric acid, and lactic acid, and citric acid or tartaric acid is preferable.

As the aliphatic carboxylic acid-based chelating agent, an aliphatic polycarboxylic acid is preferable, and an aliphatic dicarboxylic acid is more preferable.

Examples of the aliphatic carboxylic acid-based chelating agent include oxalic acid, malonic acid, succinic acid, glutaric acid, adipic acid, pimelic acid, sebacic acid, and maleic acid.

As the aromatic carboxylic acid-based chelating agent, an aromatic polycarboxylic acid is preferable, and a compound in which an aromatic ring (more preferably a benzene ring) is substituted with 2 to 6 carboxy groups is more preferable. Furthermore, the aromatic polycarboxylic acid means a compound having at least one aromatic ring and a plurality of carboxy groups.

Examples of the aromatic carboxylic acid-based chelating agent include phthalic acid, isophthalic acid, terephthalic acid, trimellitic acid, pyromellitic acid, and derivatives thereof.

As the carboxylic acid-based chelating agent, an aminopolycarboxylic acid-based chelating agent or an aliphatic carboxylic acid-based chelating agent is preferable, DTPA, oxalic acid, malonic acid, succinic acid, or adipic acid is more preferable, and malonic acid, succinic acid, or adipic acid is still more preferable.

(Phosphoric Acid-Based Chelating Agent)

The phosphonic acid-based chelating agent is a chelating agent having at least one phosphonic acid group in the molecule. Furthermore, in a case where the chelating agent has a phosphonic acid group and a carboxy group, it is classified into a carboxylic acid-based chelating agent.

Examples of the phosphonic acid-based chelating agent include an aliphatic phosphonic acid-based chelating agent and an aminophosphonic acid-based chelating agent.

Furthermore, the aliphatic phosphonic acid-based chelating agent may have a hydroxy group in addition to the phosphonic acid group and the aliphatic group.

Examples of the phosphonic acid-based chelating agent include ethylidene diphosphonic acid, 1-hydroxyethylidene-1,1'-diphosphonic acid (HEDP), 1-hydroxypropyridene-1,1'-diphosphonic acid, and 1-hydroxybutylidene-1,1'-diphosphonic acid, ethylaminobis(methylenephosphonic acid), dodecylaminobis(methylenephosphonic acid), nitrilotris(methylenephosphonic acid) (NTPO), ethylenediaminebis(methylenephosphonic acid) (EDDPO), 1,3-propylenediaminebis(methylenephosphonic acid), ethylenediaminetetra (methylenephosphonic acid) (EDTPO), ethylenediaminetetra(ethylenephosphonic acid), 1,3-propylenediaminetetra(methylenephosphonic acid) (PDTMP), 1,2-diaminopropanetetra(methylenephosphonic acid), 1,6-hexamethylenediaminetetra(methylenephosphonic acid), diethylenetriaminepenta(methylenephosphonic acid) (DEPPO), diethylenetriaminepenta(ethylenephosphonic acid), triethylenetetraminehexa(methylenephosphonic acid), and triethylenetetraminehexa(ethylenephosphonic acid), and HEDP is preferable.

The number of phosphonic acid groups contained in the phosphonic acid-based chelating agent is preferably 2 to 5, more preferably 2 to 4, and still more preferably 2 or 3.

In addition, the number of carbon atoms of the phosphonic acid-based chelating agent is preferably 12 or less, more preferably 10 or less, and still more preferably 8 or less. The lower limit is not particularly limited, and is preferably 1 or more.

As the phosphonic acid-based chelating agent, not only the compound but also the compounds described in paragraphs [0026] to [0036] of WO2018/020878A, and the compounds ((co)polymers) described in paragraphs [0031] to [0046] of WO2018/030006A, the contents of which can be incorporated herein by reference, can be used.

Moreover, the phosphonic acid-based chelating agent may be used alone or in combination of two or more kinds thereof.

In addition, some commercially available phosphonic acid-based chelating agents include water such as distilled water, deionized water, and ultrapure water in addition to the phosphonic acid-based chelating agent, but there is no problem even in a case of using such the phosphonic acid-based chelating agent including water.

In a case where the object to be purified includes the phosphonic acid-based chelating agent, it is also preferable to further include another chelating agent (preferably a carboxylic acid-based chelating agent as described above). In this case, a mass ratio of the content of the carboxylic acid-based chelating agent to the content of the phosphonic acid-based chelating agent (carboxylic acid-based chelating agent/phosphonic acid-based chelating agent) is preferably 0.1 to 10, more preferably 0.2 to 5, and still more preferably 0.6 to 1.3.

In addition, the chelating agent is preferably one or more selected from the group consisting of DTPA, oxalic acid, malonic acid, succinic acid, adipic acid, and HEDP, and more preferably one or more selected from the group consisting of oxalic acid, malonic acid, succinic acid, and adipic acid.

The chelating agent may be used alone or in combination of two or more kinds thereof.

The content of the chelating agent in the object to be purified is preferably 0.0005% to 25% by mass, more preferably 0.001% to 5% by mass, and still more preferably 0.005% to 3% by mass, with respect to the total mass of the object to be purified.

In addition, the content of the chelating agent is preferably 0.01% to 70% by mass, more preferably 0.05% to 60% by mass, and still more preferably 0.1% to 50% by mass, with respect to the total mass of the components excluding the solvent of the object to be purified.

<Polymer>

The object to be purified may include a polymer.

The polymer is a component different from each of the above-mentioned components.

The molecular weight (weight-average molecular weight in a case of having a molecular weight distribution) of the polymer is preferably more than 600, more preferably 1,000 or more, still more preferably more than 1,000, and particularly preferably more than 3,000. The upper limit of the molecular weight is, for example, 1,500,000 or less, and preferably 100,000 or less.

Among those, in a case where the polymer is a water-soluble polymer which will be described below, the weight-average molecular weight of the water-soluble polymer is preferably 1,000 or more, more preferably 1,500 or more, and still more preferably 3,000 or more. The upper limit of the weight-average molecular weight of the water-soluble polymer is not limited, and is, for example, 1,500,000 or less, preferably 1,200,000 or less, more preferably 1,000,000 or less, and still more preferably 10,000 or less.

Furthermore, in the present specification, the "weight-average molecular weight" refers to a weight-average molecular weight in terms of polyethylene glycol measured by gel permeation chromatography (GPC).

The polymer preferably has a repeating unit having a carboxy group (such as a repeating unit derived from a (meth)acrylic acid). The content of the repeating unit having a carboxy group is preferably 30% to 100% by mass, more preferably 70% to 100% by mass, and still more preferably 85% to 100% by mass, with respect to the total mass of the polymer.

In addition, the polymer preferably has a repeating unit based on a (meth)acrylamide propanesulfonic acid in addition to the repeating unit having a carboxy group.

It is also preferable that the polymer is a water-soluble polymer.

Furthermore, the "water-soluble polymer" is intended to be a compound having two or more repeating units linked in a linear or mesh form through a covalent bond, in which the mass of the polymer dissolved in 100 g of water at 20° C. is 0.1 g or more.

Examples of the water-soluble polymer include a polyacrylic acid, a polymethacrylic acid, a polymaleic acid, a polyvinyl sulfonic acid, a polyallyl sulfonic acid, a polystyrenesulfonic acid, and salts thereof; copolymers of monomers such as styrene, α-methylstyrene, and/or 4-methylstyrene and acid monomers such as a (meth)acrylic acid and/or a maleic acid, and salts thereof; polymers having repeating units having an aromatic hydrocarbon group obtained by fusing benzenesulfonic acid and/or naphthalenesulfonic acid, and the like with formalin; vinyl-based synthetic polymers such as polyvinyl alcohol, polyoxyethylene, polyvinylpyrrolidone, polyvinylpyridine, polyacrylamide, polyvinyl formamide, polyethyleneimine, polyvinyloxazoline, polyvinylimidazole, and polyallylamine; and modified products of natural polysaccharides such as hydroxyethyl cellulose, carboxymethyl cellulose, and processed starch.

The water-soluble polymer may be a homopolymer or a copolymer obtained by copolymerizing two or more kinds of monomers. Examples of such the monomer include monomers selected from the group consisting of a monomer having a carboxy group, a monomer having a sulfonic acid group, a monomer having a hydroxy group, a monomer having a polyethylene oxide chain, a monomer having an amino group, and a monomer having a heterocyclic ring.

It is also preferable that the water-soluble polymer is a polymer consisting of only structural units derived from the monomers selected from the group. In a case where the polymer is composed of substantially only a structural unit derived from the monomer selected from the group, for example, the content of the structural unit derived from the monomer selected from the group is preferably 95% to 100% by mass, and more preferably 99% to 100% by mass with respect to the mass of the polymer used.

As the polymer, a commercially available product may be used, and examples of the polymer which can be used include products which are polymers such as DISPERBYK series manufactured by BYK-Chemie, DL series, YS series, and HL series manufactured by Nippon Shokubai Co., Ltd., DEQUEST series manufactured by Thermophos Deutschland, DE, and Aron (registered trademark) series manufactured by Toagosei Co., Ltd.

In addition, examples of the polymer include the water-soluble polymers described in paragraphs [0043] to [0047] of JP2016-171294A, the contents of which are incorporated herein by reference.

The polymer may be used alone or in combination of two or more kinds thereof.

In a case where the object to be purified includes the polymer, the content of the polymer is preferably 0.01% to 10% by mass, more preferably 0.05% to 5% by mass, and still more preferably 0.1% to 3% by mass, with respect to the total mass of the object to be purified.

In addition, in a case where the object to be purified includes the polymer, the content of the polymer is preferably 0.1% to 50% by mass, more preferably 1% to 40% by mass, and still more preferably 10% to 30% by mass, with respect to the total mass of the components excluding the solvent of the object to be purified.

In a case where the content of the polymer is within the range and the obtained treatment liquid is used, the polymer can be appropriately adsorbed on a surface of a substrate to contribute to improvement of the corrosion prevention performance of the treatment liquid, and can also improve a balance between the viscosity of the treatment liquid.

<Oxidizing Agent>

The object to be purified may include an oxidizing agent.

The oxidizing agent is a component different from each of the above-mentioned components.

Examples of the oxidizing agent include peroxides, persulfides (for example, a monopersulfide and a dipersulfide), percarbonates, acids thereof, and salts thereof.

Examples of the oxidizing agent include oxidative halides (periodic acids such as iodic acid, metaperiodic acid, and orthoperiodic acid, salts thereof, and the like), perboric acid, perborate, a cerium compound, and ferricyanides (potassium ferricyanide and the like).

In a case where the object to be purified includes the oxidizing agent, the content of the oxidizing agent is preferably 0.01% to 10% by mass, more preferably 0.05% to 5% by mass, and still more preferably 0.1% to 3% by mass, with respect to the total mass of the object to be purified.

In addition, in a case where the object to be purified includes the oxidizing agent, the content of the oxidizing agent is preferably 0.1% to 50% by mass, more preferably 1% to 40% by mass, and still more preferably 10% to 30% by mass, with respect to the total mass of the components excluding the solvent of the object to be purified.

<pH Adjusting Agent>

The object to be purified may include a pH adjusting agent to adjust and maintain the pH of the object to be purified. Examples of the pH adjusting agent include a basic compound and an acidic compound other than the components.

The pH adjusting agent is intended to be a component different from each of the above-mentioned components. It should be noted that it is permissible to adjust the pH of the object to be purified by adjusting the addition amount of each of the above-mentioned components.

Examples of the basic compound include a basic organic compound and a basic inorganic compound.

The basic organic compound is a basic organic compound different from the above-mentioned basic organic compound. Examples of the basic organic compound include amine oxide, nitro, nitroso, oxime, ketoxime, aldoxime, lactam, isocyanides, and urea.

Examples of the basic inorganic compound include an alkali metal hydroxide, an alkaline earth metal hydroxide, and ammonia.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

Examples of the acidic compound include an inorganic acid.

Examples of the inorganic acid include hydrochloric acid, sulfuric acid, sulfurous acid, nitric acid, nitrite, phosphoric acid, boric acid, and hexafluorophosphoric acid. In addition, a salt of the inorganic acid may be used, and examples thereof include an ammonium salt of the inorganic acid, and more specifically, ammonium chloride, ammonium sulfate, ammonium sulfite, ammonium nitrate, ammonium nitrite, ammonium phosphate, ammonium borate, and ammonium hexafluoride phosphate.

As the acidic compound, a salt of the acidic compound may be used as long as it is an acid or an acid ion (anion) in an aqueous solution.

The pH adjusting agent may be used alone or in combination of two or more kinds thereof.

In a case where the object to be purified includes the pH adjusting agent, the content of the pH adjusting agent is selected according to types and amounts of other components, and the pH of a target object to be purified or treatment liquid, but is preferably 3% by mass or less, and more preferably 2% by mass or less, with respect to the total mass of the object to be purified. The lower limit of the content of the pH adjusting agent is, for example, more than 0% by mass, may be 0.01% by mass or more, or is also preferably 0.05% by mass or more, with respect to the total mass of the object to be purified.

In a case where the object to be purified includes the pH adjusting agent, the content of the pH adjusting agent is preferably more than 0% by mass and 50% by mass or less, and more than 0% by mass and 25% by mass or less, with respect to the total mass of the components excluding the solvent of the object to be purified.

<Water>

The object to be purified preferably includes water as a solvent.

The type of water used for the object to be purified is not particularly limited as long as it does not adversely affect a semiconductor substrate, and distilled water, deionized water, and pure water (ultrapure water) can be used. Pure water is preferable from the viewpoint that it includes almost no impurities and has less influence on a semiconductor substrate in a step of manufacturing the semiconductor substrate.

The content of water in the object to be purified may be a balance other than optional components which will be described later. The content of water, is, for example, preferably 1% by mass or more, more preferably 30% by mass or more, still more preferably 60% by mass or more, and particularly preferably 85% by mass or more with respect to the total mass of the object to be purified. The upper limit value is not particularly limited, but is preferably 99% by mass or less, and more preferably 97% by mass or less, with respect to the total mass of the object to be purified.

<Other Components>

In addition, the object to be purified may include, as other components other than the above-mentioned components, a quaternary ammonium compound, a polyhydroxy compound such as cyclodextrin, a fluorine compound, a monocarboxylic acid, and/or an organic solvent, and the like.

Examples of the quaternary ammonium compound include the compounds described in paragraphs [0028] to [0032] of WO2017/119244A, the contents of which are incorporated herein by reference.

Examples of the fluorine compound include the compounds described in paragraphs [0013] to [0015] of JP2005-150236A, the contents of which are incorporated herein by reference.

As the organic solvent, any of known organic solvents can be used, but hydrophilic organic solvents such as an alcohol and a ketone are preferable. The organic solvents may be used alone or in combination of two or more kinds thereof.

The monocarboxylic acid is a compound having only one carboxy group.

The monocarboxylic acid preferably has no acid group (a phosphonic acid group and the like) other than the carboxy group, preferably has no hydroxyl group, and preferably has no cationic group (an amino group and the like).

The molecular weight of the monocarboxylic acid is preferably 600 or less, more preferably 450 or less, and still more preferably 300 or less. The lower limit is, for example, preferably 50 or more, and more preferably 80 or more. In addition, the number of carbon atoms of the monocarboxylic acid is, for example, preferably 15 or less, more preferably 12 or less, and still more preferably 8 or less. The lower limit of the number of carbon atoms is, for example, preferably 2 or more, and more preferably 3 or more.

It is preferable that the monocarboxylic acid and the above-mentioned chelating agent are different components.

The monocarboxylic acid is preferably an aliphatic monocarboxylic acid, and more preferably sorbic acid.

The amount of each of such other components is not particularly limited, and may be appropriately set as long as the effect of the present invention is not impaired.

Furthermore, the content of each of the components in the object to be purified can be measured by a known method such as gas chromatography-mass spectrometry (GC-MS) or liquid chromatography-mass spectrometry (LC-MS), and ion-exchange chromatography (IC).

<Ratio>

It is preferable that the object to be purified includes a predetermined component at a predetermined ratio in order to realize more excellent filterability.

A mass ratio of the content of the amine compound to the content of the surfactant (the content of the amine compound/the content of the surfactant) in the object to be purified is preferably 0.1 to 5,000, more preferably 1 to 3,000, and still more preferably 2 to 1,000.

In a case where the mass ratio is within the range, the deterioration of the filter is suppressed and the filterability is more excellent.

<Physical Properties of Object to Be Purified>

(pH)

From the viewpoint that the filterability is more excellent, the pH of the object to be purified is preferably 6 to 14, more preferably 7 to 13, and still more preferably 8 to 12.

In a case where the pH of the object to be purified is within the range, the deterioration of the filter is suppressed and the filterability is more excellent.

Furthermore, the pH can be measured by a method based on JIS Z8802-1984, using a known pH meter.

In the present specification, the measurement temperature of pH is 25° C.

<Preparation of Object to Be Purified>

The method for producing an object to be purified is not particularly limited, and for example, an object to be purified can be produced by mixing each of the above-mentioned components. The order and/or the timing of mixing each of the above-mentioned components is not particularly limited, and for example, a specific surfactant, an amine compound, a chelating agent, a polymer, an oxidizing agent, and/or the other components added sequentially to a container to which purified water has been incorporated, and then the mixture is stirred and mixed while a pH adjusting agent is added to the mixture to adjust the pH of the mixed solution, thereby performing the preparation, may be mentioned. In addition, in a case where water and each component are added to the container, they may be added all at once or dividedly a plurality of times.

A stirring device and a stirring method used for liquid production are not particularly limited, and a known device as a stirrer or a disperser may be used. Examples of the stirrer include an industrial mixer, a portable stirrer, a mechanical stirrer, and a magnetic stirrer. Examples of the disperser include an industrial disperser, a homogenizer, an ultrasonic disperser, and bead mills.

[Treatment Liquid]

The treatment liquid produced by the production method of the embodiment of the present invention is preferably a purified product in which a content of impurities included in the above-mentioned object to be purified is reduced.

That is, the treatment liquid is preferably substantially the same as the above-mentioned object to be purified, except that the content of the impurities is reduced, and preferred conditions such as the components included in the treatment liquid and the contents are also the same as those of the above-mentioned preferred conditions for the object to be purified.

It should be noted that in a case where the treatment liquid serves as a diluted treatment liquid which will be described later, a suitable content of each component (excluding water) with respect to the total mass of the diluted treatment liquid is, for example, obtained by dividing the amount described as the suitable content of each component with respect to the total mass of the object to be purified by a dilution ratio (for example, 100) in the range.

[Filter]

Next, a filter used in the production method of the embodiment of the present invention will be described.

<First Filter>

At least a first filter is used in the method of the embodiment of the present invention.

The first filter is a filter having at least a first filter medium, and an example of the structure thereof will be described with reference to FIG. 1.

FIG. 1 is a partial cutaway perspective view of a typical first filter.

In the first filter 40, a cylindrical first filter medium 41 and a cylindrical core 42 supporting the first filter medium 41 are disposed inside the cylindrical filter medium. The cylindrical core 42 is formed in a mesh shape so that a liquid can easily pass therethrough. The first filter medium 41 and the core 42 are concentric circles. Moreover, a cap 43 for preventing liquid from entering from the upper part is disposed above the cylindrical first filter medium 41 and the core 42. In addition, a liquid outlet 44 for taking out the liquid from the inside of the core 42 is disposed below the first filter medium 41 and the core 42.

Since the liquid (object to be purified) flowing into the first filter 40 is obstructed by the cap 43, it passes through the first filter medium 41 and the core 42, flows into the inside of the core 42, and flows from the liquid outlet 44 to the outside of the first filter 40.

Furthermore, in the first filter 40, the core 42 is disposed inside the filter medium 41, but is not limited to this form, and a protector (having the same form same as that of the core 42, but having the different radius from that of the core 42) is provided on the outside of the first filter medium 41.

(First Filter Medium)

The first filter medium includes at least one material selected from the group consisting of a nylon, a polyallyl sulfonic acid, a perfluoroalkoxy alkane which has been subjected to a hydrophilization treatment, a polytetrafluoroethylene which has been subjected to a hydrophilization treatment, a polyolefin which has been subjected to a hydrophilization treatment, and a polyvinylidene fluoride which has been subjected to a hydrophilization treatment. The first filter medium may be at least one kind of the material itself.

Examples of the nylon include nylon 6 and nylon 6,6.

Examples of the polyolefin include polyethylene and polypropylene. Examples of the polyethylene include an ultra-high density polyethylene (UPE) and a high-density polyethylene (HDPE).

The hydrophilization treatment in the perfluoroalkoxy alkane which has been subjected to a hydrophilization treatment, the polytetrafluoroethylene which has been subjected to a hydrophilization treatment, the polyolefin which has been subjected to a hydrophilization treatment, and the polyvinylidene fluoride which has been subjected to a hydrophilization treatment is not particularly limited as long as it is a treatment for hydrophilizing a surface of the material.

Examples of the hydrophilization treatment include a plasma treatment, an ultraviolet irradiation treatment, a corona treatment, an electron beam irradiation treatment, an acid treatment, an alkali treatment, and an ozone treatment.

One kind or a combination of two or more kinds of these hydrophilization treatments may be carried out.

The plasma treatment is a treatment in which a high-frequency voltage is applied in the presence of a gas to generate a plasma, and a surface modification is performed using a gas excited by the plasma.

The plasma treatment may be an atmospheric pressure plasma treatment (for example, a plasma treatment carried out under a pressure of 0.9 to 1.1 atm) or a vacuum plasma treatment.

Examples of a treatment gas used for the plasma treatment include oxygen, air, nitrogen, argon, helium, ammonia, carbon monoxide, water vapor, and a mixed gas of two or more kinds thereof.

A gas converted into the plasma can be generated by applying an electric field such as a high-frequency wave, a pulse wave, and a microwave while supplying such a treatment gas between the opposing electrodes to generate a glow discharge plasma.

The temperature at which the plasma treatment is performed is, for example, 10° C. to 50° C.

The treatment time of the plasma treatment is, for example, 1 to 1,000 seconds.

Examples of a light source for the ultraviolet irradiation treatment include lamps such as a metal halide lamp, a xenon lamp, a carbon arc lamp, a chemical lamp, a low-pressure mercury lamp, and a high-pressure mercury lamp.

It is also preferable that the wavelength range of the ultraviolet rays to be irradiated includes a range of far ultraviolet rays (280 nm to 100 nm). Specifically, for example, a low-pressure mercury lamp that emits far ultraviolet rays at 185 nm and 254 nm, or a xenon excimer lamp that emits far ultraviolet rays at 172 nm can be preferably used.

In a case where these ultraviolet rays are irradiated, it is also preferable that the irradiation is performed in the presence of an oxygen gas.

The irradiation conditions vary depending on each lamp and are not particularly limited, but examples thereof include a method of performing irradiation with a low-pressure mercury lamp at a light amount of 5 to 5,000 $mJ/cm^2$ for 5 seconds to 10 minutes, and a method of performing irradiation with an excimer lamp at a light amount in the range of 1 to 3,000 $mJ/cm^2$ for 1 second to 3 minutes.

Furthermore, a nylon and/or a polyallyl sulfonic acid in the first filter medium may be subjected to the hydrophilization treatment.

In addition, the first filter medium may be subjected to a treatment other than the hydrophilization treatment, as desired.

The first filter medium preferably has at least one material selected from the group consisting of a nylon, a polyallyl sulfonic acid, a perfluoroalkoxy alkane which has been subjected to a hydrophilization treatment, and a polytetrafluoroethylene which has been subjected to a hydrophilization treatment, more preferably includes the nylon or the polyallyl sulfonic acid, and still more preferably include the polyallyl sulfonic acid. It is also preferable that the first filter medium is the material itself.

A contact angle of the first filter medium with water is preferably 0° to 70°, more preferably 0° to 50°, and still more preferably 0° to 35°.

Furthermore, the contact angle with water is a contact angle obtained by measuring a static contact at 1 second after dropping 1 μL of water onto a surface of the first filter medium in an atmosphere at an atmospheric pressure, a temperature of 25° C., and a relative humidity of 60%.

The pore diameter of the first filter medium is preferably 50 μm or less, more preferably 200 nm or less, still more preferably 50 nm or less, and particularly preferably 25 nm or less, from the viewpoint that the filterability is more excellent. The lower limit value is not particularly limited, but is, for example, preferably 1 nm or more from the viewpoint of a productivity.

Furthermore, in the present specification, the pore diameter of the filter means a pore diameter determined by a bubble point of isopropanol (IPA).

<Second Filter>

In the method of the embodiment of the present invention, the filtration of the object to be purified may be performed using the first filter and a second filter including a second filter medium, which is different from the first filter.

Examples of the structure of the second filter include a structure in which the first filter medium is replaced with the second filter medium in the first filter.

The second filter may or may not satisfy the requirements as the first filter as described above. That is, the second filter medium may or may not satisfy the requirements as the first filter medium as described above.

In a case where the second filter satisfies the above-mentioned requirements for the first filter, preferred conditions for such a second filter are the same as the above-mentioned preferred conditions for the first filter.

For example, the second filter medium of the second filter may include at least one material selected from the group consisting of a nylon, a polyallyl sulfonic acid, a perfluoroalkoxy alkane which has been subjected to a hydrophilization treatment, a polytetrafluoroethylene which has been subjected to a hydrophilization treatment, a polyolefin which has been subjected to a hydrophilization treatment, and a polyvinylidene fluoride which has been subjected to a hydrophilization treatment, and conditions for making such the second filter medium, preferred conditions thereof, and the like are the same as the conditions for making the first filter medium, the preferred conditions thereof, and the like.

In a case where the second filter medium does not satisfy the requirements as the first filter medium, for example, the second filter medium includes at least one material selected from the group consisting of a perfluoroalkoxy alkane which has not been subjected to a hydrophilization treatment, a polytetrafluoroethylene which has not been subjected to a hydrophilization treatment, a polyolefin which has not been subjected to a hydrophilization treatment, and a polyvinylidene fluoride which has not been subjected to a hydrophilization treatment. The first filter medium may be at least one kind of the material itself.

Examples of the polyolefin include polyethylene and polypropylene. Examples of the polyethylene include an ultra-high density polyethylene (UPE) and a high-density polyethylene (HDPE).

In a case where the second filter medium does not satisfy the requirements as the first filter medium, the pore diameter of the second filter medium is preferably 1,000 nm or less, more preferably 200 nm or less, and still more preferably 100 nm or less, from the viewpoint that the filterability is more excellent. The lower limit value is not particularly limited, but is preferably more than 10 nm, and more preferably 25 nm or more in order to easily avoid bubble clogging.

[Filtration]

In the production method of the embodiment of the present invention, a treatment liquid for a semiconductor substrate is produced by filtering an object to be purified using a first filter.

The first filter, the object to be purified, and the treatment liquid are as mentioned above.

The filtration may be filtration using only the first filter.

In addition, the filtration may be a filtration using a plurality of (for example, 2 to 5) filters for filtering the object to be purified, in which the first filter and a second filter including a second filter medium, which is different from the first filter, are used.

The second filter is as mentioned above.

In a case of the filtration using a plurality of filters, at least one of the plurality of filters is a filter that satisfies the requirements as the first filter as described above.

Hereinafter, the filter that satisfies the requirements as the first filter is also referred to as a "requirement-satisfying filter".

In a case where one requirement-satisfying filter among at least one requirement-satisfying filter present in the plurality of filters is defined as the first filter, a filter present on the upstream side or the downstream side of the first filter in the filtration flow path can be a second filter, and the filter present on the upstream side is preferably the second filter.

Furthermore, the second filter may be a requirement-satisfying filter.

In the production method of the embodiment of the present invention, it is also preferable that the pore diameter of the second filter medium is the same as or larger than the pore diameter of the first filter medium, and the object to be purified is passed through the second filter and the first filter in this order to perform the filtration of the object to be purified.

Specifically, a ratio (the pore diameter of the second filter medium/the pore diameter of the first filter medium) of the pore diameter of the second filter medium in the second filter to the pore diameter of the first filter medium in the first filter is preferably 1 to 1,000, more preferably 2 to 500, and still more preferably 3 to 50.

In a case where a plurality of combinations of the first filter and the second filter present on the upstream side of the first filter can be present within the filtration flow path, it is preferable that at least one of the combinations satisfies the relationship as mentioned above, it is more preferable that two or more of the combinations satisfy the relationship as mentioned above, and it is still more preferable that all the combinations satisfy the relationship as mentioned above.

A differential pressure between before and after the filter (hereinafter also referred to as a "filtration pressure") at the time of passing the object to be purified through is preferably 0.005 MPa or more, more preferably 0.01 MPa or more, still more preferably 0.05 MPa or more, and particularly preferably 0.2 MPa or more. In addition, the filtration pressure is preferably 1 MPa or less, more preferably 0.6 MPa or less, and still more preferably 0.4 MPa or less.

In a case where the filtration is filtration using a plurality of filters, it is preferable that the filtration pressure in at least one filter is within the range, it is more preferable that the filtration pressure in at least the first filter is within the range, and it is still more preferable that the filtration pressures of the first filter and the second filter are within the ranges.

The filtration may be circulation filtration or may not be circulation filtration.

The number of times of circulation filtration (number of circulations) is not particularly limited, and is, for example, preferably 2 to 10. Furthermore, in the circulation filtration, it is preferable that the object to be purified is returned to the upstream so that at least the filtration by the first filter is repeated, and it is more preferable that the object to be purified is returned to the upstream so that the filtration by both the first filter and the second filter is repeated.

In the production method of the embodiment of the present invention, another treatment may be performed before, after, or during the filtration. For example, the object to be purified may be filtered by a method other than the above-mentioned filtration. In addition, an ion exchange step and/or a destaticizing step may be performed.

As the ion exchange step, the steps described in paragraphs [0078] to [0081] of WO2018/180735A, the contents which are incorporated herein by reference, can be used.

As the destaticization step, the step described in paragraph [0082] of WO2018/180735A, the contents which are incorporated herein by reference, can be used.

(Container)

The object to be purified provided for the production method of the embodiment of the present invention and/or the treatment liquid produced by the production method of the embodiment of the present invention is not limited as long as it has no problem such as corrosiveness, and can be filled in any container to be stored, transported, and used.

In semiconductor applications, as the container, a container that has a high degree of cleanliness inside the container, and suppresses elution of impurities from an inner wall of an accommodating portion of the container into each liquid is preferable. Examples of such a container include various containers commercially available as a container for a semiconductor cleaning liquid, such as "Clean Bottle" series manufactured by AICELLO MILIM CHEMICAL Co., Ltd. and "Pure Bottle" manufactured by Kodama Plastics Co., Ltd., but the container is not limited thereto.

In addition, as the container, a container in which a liquid contact portion with each liquid, such as an inner wall of the accommodating portion, is formed from a fluorine-based resin (perfluororesin) or a metal which has been subjected to rust prevention and metal elution prevention treatments is preferable.

The inner wall of the container is preferably formed from one or more resins selected from the group consisting of a polyethylene resin, a polypropylene resin, and a polyethylene-polypropylene resin, other resins, and a metal which has been rust prevention and metal elution preventing treatments, such as stainless steel, Hastelloy, Inconel, and Monel.

As such other resins, a fluorine-based resin (perfluororesin) is preferable. In this manner, by using a container having an inner wall formed of a fluorine-based resin, occurrence of a problem of elution of ethylene or propylene oligomers can be suppressed, as compared with a container having an inner wall formed of a polyethylene resin, a polypropylene resin, or a polyethylene-polypropylene resin.

Specific examples of such a container having an inner wall which is a fluorine-based resin include a FluoroPurePFA composite drum manufactured by Entegris Inc. In addition, the containers described on page 4 of JP1991-502677A (JP-H03-502677A), page 3 of WO2004/016526A, and pages 9 and 16 of WO99/046309A can also be used.

In addition, for the inner wall of the container, quartz and an electropolished metal material (that is, a completely electropolished metal material) are also preferably used, in addition to the above-mentioned fluorine-based resin.

The metal material used for producing the electropolished metal material is preferably a metal material which includes at least one selected from the group consisting of chromium and nickel, and has a total content of chromium and nickel of more than 25% by mass with respect to the total mass of the metal material, and examples thereof include stainless steel and a nickel-chromium alloy.

The total content of chromium and nickel in the metal material is more preferably 30% by mass or more with respect to the total mass of the metal material.

In addition, the upper limit value of the total content of Cr and Ni in the metal material is not particularly limited, but is generally preferably 90% by mass or less.

A method for electropolishing the metal material is not particularly limited, and a known method can be used. For example, the methods described in paragraphs [0011] to [0014] of JP2015-227501A, paragraphs [0036] to [0042] of JP2008-264929A, or the like can be used.

The inside of these containers is preferably cleaned before an object to be filled is filled. For the liquid used for the cleaning, the amount of the metal impurities in the liquid is preferably reduced. The object to be purified or the treatment liquid may be bottled in a container such as a gallon bottle and a coated bottle after the production, and transported, and stored.

In order to prevent the change in the components in the object to be purified or the treatment liquid during the storage, the inside of the container may be replaced with inert gas (nitrogen, argon, or the like) with a purity of 99.99995% by volume or more. In particular, a gas having a low moisture content is preferable. In addition, during the transportation and the storage, the temperature may be controlled to a normal temperature in the range of −20° C. to 20° C. to prevent deterioration.

(Clean Room)

It is preferable that handlings including implementation of the production method of the embodiment of the present invention, opening and cleaning of the container, filling of the object to be purified and the treatment liquid, and the like, treatment analysis, and measurements are all performed in a clean room. It is preferable that the clean room satisfies 14644-1 clean room standards. It is preferable that the clean room satisfies any one of International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

[Applications of Treatment Liquid]

The treatment liquid produced by the production method of the embodiment of the present invention is a treatment liquid for a semiconductor substrate, and is preferably a treatment liquid that is applied to a semiconductor substrate which has been subjected to a chemical mechanical polishing (CMP) treatment.

In addition, it is also preferable that the treatment liquid produced by the production method of the embodiment of the present invention is a cleaning liquid for a semiconductor substrate in a process for producing a semiconductor substrate.

Among these, the treatment liquid is preferably a cleaning liquid to be used in a cleaning step of cleaning a semiconductor substrate which has been subjected to a chemical mechanical polishing (CMP) treatment.

Furthermore, in a use of the treatment liquid (cleaning of a semiconductor substrate, or the like), additional components may be further added to the treatment liquid before use.

In addition, in a use of the treatment liquid, the treatment liquid may be diluted before use.

The diluted treatment liquid thus obtained by diluting the treatment liquid is also a form of the treatment liquid.

A dilution ratio of the diluted treatment liquid can be appropriately adjusted according to a type and a content of each component, and a semiconductor substrate and the like as an object to be treated, for example, an object to be cleaned but the ratio (dilution ratio) of the diluted treatment liquid to the treatment liquid before dilution is preferably 10 to 10,000, more preferably 20 to 3,000, and still more preferably 50 to 1,000 in terms of a mass ratio or volume ratio (volume ratio at 25° C.).

In addition, it is preferable that the treatment liquid is diluted with water.

That is, a treatment liquid (diluted treatment liquid) including each component in an amount obtained by dividing a suitable content of each component (excluding water) which can be included in the above-mentioned object to be purified by a dilution ratio in the range (for example, 100) can also be suitably put into practical use.

In other words, the suitable content of each component (excluding water) with respect to the total mass of the diluted treatment liquid is, for example, obtained by dividing the amount described as the suitable content of each component with respect to the total mass of the object to be purified by a dilution ratio in the range (for example, 100).

Furthermore, the same object (and object to be cleaned and the like) may be subjected to a treatment, using another treatment liquid, before and/or after (preferably after) a use of the treatment liquid produced by the production method of the embodiment of the present invention (cleaning of a semiconductor substrate, and the like).

As long as at least the treatment using the treatment liquid produced by the production method of the embodiment of the present invention is performed, such another treatment liquid used for the same object before and/or after the treatment may or may not correspond to the treatment liquid produced by the production method of the embodiment of the present invention.

Hereinafter, such another treatment liquid is also referred to as a second treatment liquid.

It is considered that an object to be cleaned can be obtained with a higher accuracy and a less damage by performing a two-stage treatment such as a treatment using a second treatment liquid including no surfactant or a treatment using a second treatment liquid including a damage inhibitor (an anticorrosion agent and the like) during cleaning of an object to be cleaned, in addition to the treatment using the treatment liquid produced by the production method of the embodiment of the present invention.

In the two-stage treatment, it is preferable that a treatment using a treatment liquid produced by the production method of the embodiment of the present invention is performed as the first-stage treatment, and a treatment using a second treatment liquid including no surfactant, or a second treatment liquid including a component that protects the metal-containing substance contained in an object (an object to be cleaned and the like) is performed as the second-stage treatment.

It is preferable to use a second treatment liquid including no surfactant, in particular, from the viewpoint of residue removability in the object after the treatment. It is preferable to use a second treatment liquid that includes a component protecting a metal-containing substance, in particular, from the viewpoint of suppressing a damage to the object during finishing of the object.

The second treatment liquid may include each component described as a component which can be contained in the above-mentioned object to be purified. In addition, the second treatment liquid may include each of the components at a content described as a content in which the object to be purified can include each component.

(In this case, in the description of the content of each component in the object to be purified, appropriate and rational replacements are performed, for example, the description of "with respect to the total mass of the object to be purified" may be replaced with the description of "with respect to the total mass of the second treatment liquid", and the description of "with respect to the total mass of the components excluding the solvent of the object to be purified" may be replaced with "with respect to the total mass of the components excluding the solvent of the second treatment liquid")

It should be noted that the second treatment liquid may not include a specific surfactant.

As mentioned above, the second treatment liquid may or may not include a surfactant. The surfactant which can be included in the second treatment liquid may be the specific surfactant or a surfactant other than the specific surfactant.

Examples of the surfactant other than the specific surfactant which can be included in the second treatment liquid include a cationic surfactant, an anionic surfactant other than the specific surfactant, and a nonionic surfactant other than the specific surfactant.

The cationic surfactant is preferably a non-polymeric compound having one or more (preferably one or two) cationic nitrogen atoms ($N^+$).

The cationic nitrogen atom ($N^+$) may be contained in a pyridinium ring.

In addition, the cationic surfactant containing only the cationic nitrogen atom ($N^+$) in a form which is not contained in the pyridinium ring preferably has 5 or more carbon atoms, and more preferably has 5 to 50 carbon atoms.

The cationic surfactant containing a cationic nitrogen atom ($N^+$) in a form which is contained in the pyridinium ring preferably has 5 or more carbon atoms, more preferably has 5 to 50 carbon atoms, and still more preferably has 10 to 50 carbon atoms.

It is also preferable that the cationic nitrogen atom ($N^+$) forms a salt together with a counter anion. Examples of the counter anion include $OH^-$, and halogen anions such as $Cl^-$ and $Br^-$.

As the cationic surfactant, one or more salts (for example, one or more of a hydroxide, a chloride, and a bromide) selected from the group consisting of cetyltrimethylammonium, stearyltrimethylammonium, laurylpyridinium, cetylpyridinium, 4-(4-diethylaminophenylazo)-1-(4-nitrobenzyl)pyridinium, benzalkonium, benzethonium, benzyldimethyldodecylammonium, benzyldimethylhexadecylammonium, hexadecyltrimethylammonium, dimethyldioctadecylammonium, dodecyltrimethylammonium, didecylmethylpolyoxyethylammonium, didodecyldimethylammonium, tetraheptylammonium, tetrakis(decyl)ammonium, and dimethyldihexadecylammonium are preferable.

A commercially available product may be used as the cationic surfactant, and examples of the cationic surfactant which can be used include products corresponding to cationic surfactants in Kohtamin series manufactured by Kao Corporation, Pionin series manufactured by Takemoto Oil & Fat Co., Ltd., and Surflon series manufactured by AGC Seimi Chemical Co., Ltd.

In the second treatment liquid, one kind of surfactant may be used alone, or two or more kinds of surfactants may be used. In a case where the second treatment liquid includes a surfactant, the surfactant may be the specific surfactant, a surfactant other than the specific surfactant, or both of those.

In a case where the second treatment liquid includes the surfactant, the content of the surfactant is preferably 0.00001% to 10% by mass, more preferably 0.0001% to 3% by mass, and still more preferably 0.002% to 1.5% by mass, with respect to the total mass of the second treatment liquid.

In addition, in a case where the second treatment liquid includes the surfactant, the content of the surfactant is preferably 0.001% to 50% by mass, more preferably 0.05% to 20% by mass, and still more preferably 1% to 10% by mass, with respect to the total mass of the components excluding the solvent of the second treatment liquid.

Furthermore, "the total mass of the components excluding the solvent of the second treatment liquid" means a total content of all the components included in the cleaning liquid other than water and the organic solvent.

It is also preferable that the second treatment liquid includes an amine compound.

The amine compound which can be included in the second treatment liquid is the same as the amine compound described in the description of the liquid to be treated.

In the second treatment liquid, the amine compound may be used alone or in combination of two or more kinds thereof.

In a case where the second treatment liquid includes the amine compound, the content of the amine compound is preferably 0.01% to 30% by mass, more preferably 0.1% to 20% by mass, and still more preferably 1% to 10% by mass, with respect to the total mass of the second treatment liquid.

In addition, in a case where the second treatment liquid includes the amine compound, the content of the amine compound is preferably 5% to 90% by mass, more preferably 20% to 80% by mass, and still more preferably 40% to 70% by mass, with respect to the total mass of the components excluding the solvent of the second treatment liquid.

In addition, it is also preferable that the second treatment liquid includes at least one compound (hereinafter also referred to as a "specific nitrogen-containing compound") included in any one of the amine compound and the amino acid-based chelating agent described in the description of the liquid to be treated.

As the specific nitrogen-containing compound included in the second treatment liquid, an amino alcohol, an amine compound having a cyclic structure, or an amino acid-based chelating agent is preferable, and the amino alcohol is more preferable.

The specific nitrogen-containing compound included in the second treatment liquid may be used alone or in combination of two or more kinds thereof.

In a case where the second treatment liquid includes only one specific nitrogen-containing compound, it is preferable that the second treatment liquid includes the amino alcohol. In addition, in a case where the second treatment liquid includes two or more kinds of specific nitrogen-containing compounds, it is preferable that the second treatment liquid includes at least two selected from the group consisting of an amino alcohol, an amine compound having a cyclic structure, and an amino acid-based chelating agent, and it is more preferable that the second treatment liquid includes an amino alcohol, and at least one selected from the group consisting of an amine compound having a cyclic structure and an amino acid-based chelating agent.

The amino alcohol included in the second treatment liquid as the specific nitrogen-containing compound is the same as the amino alcohol described in the description of the liquid to be treated.

The amine compound having a cyclic structure included in the second treatment liquid as the specific nitrogen-containing compound may be the same as the amine compound having a cyclic structure described in the description of the liquid to be treated, and examples thereof include a pyridine compound, a pyrazine compound, a pyrimidine compound, and a triazine compound. Here, the triazine compound is a compound having a triazine ring.

Examples of the pyridine compound, the pyrazine compound, the pyrimidine compound, and the triazine compound include a compound in which at least one substituent selected from the group consisting of an amino group, a hydroxy group, and a carboxy group is substituted in a hetero-6-membered ring (a pyridine ring, a pyrazine ring, a pyrimidine ring, and a triazine ring), each contained in the compound, and proton tautomers thereof. For example, uracil is a proton tautomer of 2,4-dihydroxypyrimidine and cytosine is a proton tautomer of 4-aminopyrimidin-2-ol.

As the amine compound having a cyclic structure included in the second treatment liquid, the pyridine compound or the pyrimidine compound is preferable, and 2-aminopyrimidine, 2,4-diaminopyrimidine, 2,4,6-triaminopyrimidine, 2,6-dihydroxypyridine, uracil, or cytosine is more preferable.

The amino acid-based chelating agent included in the second treatment liquid as the specific nitrogen-containing compound is the same as the amino acid-based chelating agent described in the description of the liquid to be treated.

Among those, the basic amino acids are preferable, and histidine, arginine, or lysine is more preferable.

In a case where the second treatment liquid includes the nitrogen-containing compound, the content of the nitrogen-containing compound is preferably 0.01% to 30% by mass, more preferably 0.1% to 20% by mass, and still more preferably 1% to 10% by mass, with respect to the total mass of the second treatment liquid.

In addition, in a case where the second treatment liquid includes the nitrogen-containing compound, the content of the nitrogen-containing compound is preferably 5% to 90% by mass, more preferably 20% to 80% by mass, and still more preferably 40% to 70% by mass, with respect to the total mass of the components excluding the solvent of the second treatment liquid.

It is also preferable that the second treatment liquid includes a chelating agent.

The chelating agent which can be included in the second treatment liquid is the same as the chelating agent described in the description of the liquid to be treated.

In the second treatment liquid, one kind of chelating agent may be used alone, or two or more kinds of chelating agents may be used.

In a case where the second treatment liquid includes the chelating agent, the content of the chelating agent is preferably 0.01% to 30% by mass, more preferably 0.1% to 20% by mass, and still more preferably 1% to 10% by mass, with respect to the total mass of the second treatment liquid.

In addition, in a case where the second treatment liquid includes the chelating agent, the content of the chelating agent is preferably 1% to 70% by mass, more preferably 10% to 60% by mass, and still more preferably 20% to 50% by mass, with respect to the total mass of the components excluding the solvent of the second treatment liquid.

It is also preferable that the second treatment liquid includes a polymer.

The polymer which can be included in the second treatment liquid is the same as that of the polymer described in the description of the liquid to be treated.

In the second treatment liquid, one kind of polymer may be used alone, or two or more kinds of the polymer may be used.

In a case where the second treatment liquid includes the polymer, the content of the polymer is preferably 0.001% to 20% by mass, more preferably 0.01% to 10% by mass, and still more preferably 0.1% to 5% by mass, with respect to the total mass of the second treatment liquid.

In addition, in a case where the second treatment liquid includes the polymer, the content of the polymer is preferably 0.01% to 40% by mass, more preferably 0.1% to 30% by mass, and still more preferably 1% to 20% by mass, with respect to the total mass of the components excluding the solvent of the second treatment liquid.

It is also preferable that the second treatment liquid includes a pH adjusting agent.

The pH adjusting agent which can be included in the second treatment liquid is the same as the pH adjusting agent described in the description of the liquid to be treated.

In the second treatment liquid, one kind of pH adjusting agent may be used alone, or two or more kinds of pH adjusting agents may be used.

In a case where the second treatment liquid includes the pH adjusting agent, the content of the pH adjusting agent is preferably more than 0% by mass and 3% by mass or less, and more preferably more than 0% by mass and 2% by mass or less, with respect to the total mass of the second treatment liquid.

In addition, in a case where the second treatment liquid includes the pH adjusting agent, the content of the pH adjusting agent is preferably more than 0% by mass and 50% by mass or less, and more preferably more than 0% by mass and 25% by mass or less, with respect to the total mass of the components excluding the solvent of the second treatment liquid.

It is also preferable that the second treatment liquid includes water.

The water which can be included in the second treatment liquid is the same as the water described in the description of the liquid to be treated.

In a case where the second treatment liquid includes water, the content of the water is preferably 1% by mass or more, more preferably 30% by mass or more, still more preferably 60% by mass or more, and particularly preferably 85% by mass or more, with respect to the total mass of the second treatment liquid. The upper limit value is not particularly limited, but is preferably 99% by mass or less, and more preferably 97% by mass or less, with respect to the total mass of the second treatment liquid.

It is also preferable that the second treatment liquid includes a monocarboxylic acid.

The monocarboxylic acid which can be included in the second treatment liquid is the same as the monocarboxylic acid described in the description of the liquid to be treated.

In the second treatment liquid, one kind of monocarboxylic acid may be used alone, or two or more kinds of monocarboxylic acids may be used.

In a case where the second treatment liquid includes the monocarboxylic acid, the content of the monocarboxylic acid is preferably 0.0001% to 10% by mass, more preferably 0.001% to 2% by mass, and still more preferably 0.005% to 0.5% by mass, with respect to the total mass of the second treatment liquid.

In addition, in a case where the second treatment liquid includes the monocarboxylic acid, the content of the monocarboxylic acid is preferably 0.001% to 25% by mass, more preferably 0.01% to 10% by mass, and still more preferably 0.1% to 3% by mass, with respect to the total mass of the components excluding the solvent of the second treatment liquid.

In a case where the second treatment liquid includes two or more kinds of specific nitrogen-containing compounds, it is also preferable that the second treatment liquid further includes a polycarboxylic acid from the viewpoint that the effect of the present invention is more excellent.

Examples of the polycarboxylic acid include a polymer having a repeating unit having a carboxy group and an aromatic polycarboxylic acid.

Examples of the polymer having a repeating unit having a carboxy group include the polymer having a repeating unit having a carboxy group (for example, a repeating unit derived from a (meth)acrylic acid) among the polymers described in the description of the liquid to be treated. Examples of commercially available products of such a polymer include a YS series manufactured by Nippon Shokubai Co., Ltd., Aron series manufactured by Toa Gosei Co., Ltd., a DISPERBYK series manufactured by BYK-Chemie, DL series and HL series manufactured by Nippon Shokubai Co., Ltd., and DEQUEST series manufactured by Thermophos Deutschland, DE.

The aromatic polycarboxylic acid included in the second treatment liquid is the same as the aromatic polycarboxylic acid described in the description of the liquid to be treated, including a preferred aspect thereof. Among those, phthalic acid, trimellitic acid, or pyromellitic acid is preferable as the aromatic polycarboxylic acid included in the second treatment liquid.

The pH of the second treatment liquid is preferably 2 or more and less than 7.

The second treatment liquid can be produced, for example, by mixing the respective components which can be included in the second treatment liquid. The order and/or the timing of mixing the respective components is not particularly limited, and the respective components may be added all at once or may be added in a plurality of divided portions.

In addition, the second treatment liquid may or may not be filtered by the same procedure as described in the production method of the embodiment of the present invention.

Moreover, in the use of the second treatment liquid, the second treatment liquid may be diluted before use. The diluted second treatment liquid thus diluted is also one form of the second treatment liquid.

A dilution ratio of the diluted second treatment liquid can be appropriately adjusted according to a type and a content of each component, and a semiconductor substrate and the like as an object to be treated, for example, to be cleaned but the ratio (dilution ratio) of the diluted second treatment liquid to the second treatment liquid before dilution is preferably 10 to 10,000, more preferably 20 to 3,000, and still more preferably 50 to 1,000 in terms of a mass ratio or volume ratio (volume ratio at 25° C.).

In addition, it is preferable that the second treatment liquid is diluted with water.

That is, the second treatment liquid (diluted second treatment liquid) including each component in an amount obtained by dividing a suitable content of each component (excluding water) which can be included in the above-mentioned second treatment liquid by a dilution ratio in the range (for example, 100) can also be suitably put into practical use.

In other words, the suitable content of each component (excluding water) with respect to the total mass of the diluted second treatment liquid is, for example, obtained by dividing the amount described as the suitable content of each component with respect to the total mass of the second treatment liquid (second treatment liquid before dilution) by a dilution ratio in the range (for example, 100).

Hereinafter, a use method in a case where the treatment liquid is used to clean a semiconductor substrate which has been subjected to a chemical mechanical polishing (CMP) treatment will be described in detail.

<Object to be Cleaned>

Examples of an object to be cleaned by the treatment liquid include a semiconductor substrate having a metal-containing substance.

Furthermore, the expression "on the semiconductor substrate" in the present specification encompasses, for example, front and back surfaces, a side surface, and the inside of a groove of the semiconductor substrate. In addition, the metal-containing substance on the semiconductor substrate encompasses not only a case where the metal-containing substance is directly on a surface of the semiconductor substrate but also a case where the metal-containing substance is present on the semiconductor substrate through another layer.

Examples of the metal included in the metal-containing substance include at least one metal M selected from the group consisting of copper (Cu), cobalt (Co), tungsten (W), titanium (Ti), tantalum (Ta), ruthenium (Ru), chromium (Cr), hafnium (Hf), osmium (Os), platinum (Pt), nickel (Ni), manganese (Mn), zirconium (Zr), molybdenum (Mo), lantern (La), and iridium (Ir).

The metal-containing substance only needs to be a substance containing a metal (metal atom), and examples thereof include a simple substance of the metal M, an alloy including the metal M, an oxide of the metal M, a nitride of the metal M, and an acid nitride of the metal M.

In addition, the metal-containing substance may be a mixture including two or more of these compounds.

Furthermore, the oxide, the nitride, and the oxynitride may be a composite oxide, a composite nitride, or a composite oxynitride, including a metal.

The content of the metal atom in the metal-containing substance is preferably 10% by mass or more, more preferably 30% by mass or more, and still more preferably 50% by mass or more with respect to the total mass of the metal-containing substance. The upper limit is 100% by mass since the metal-containing substance may be the metal itself.

The semiconductor substrate preferably has a metal M-containing substance including a metal M, and more preferably has a metal-containing substance (a copper-containing substance, a cobalt-containing substance, a tungsten-containing substance, a titanium-containing substance, a tantalum-containing substance, a ruthenium-containing substance, and the like) including at least one metal selected from the group consisting of W, Co, Cu, Ti, Ta, and Ru, and still more preferably has a metal-containing substance including at least one metal selected from the group consisting of W and Co.

The semiconductor substrate to be cleaned by the treatment liquid is not particularly limited, and examples thereof include a substrate having a metal wiring line film, a barrier metal, and an insulating film on a surface of a wafer constituting the semiconductor substrate.

Specific examples of the wafer constituting a semiconductor substrate include a wafer consisting of a silicon-based material, such as a silicon (Si) wafer, a silicon carbide (SiC) wafer, and a silicon-including resin-based wafer (glass epoxy wafer), a gallium phosphorus (GaP) wafer, a gallium arsenic (GaAs) wafer, and an indium phosphorus (InP) wafer.

The silicon wafer may be an n-type silicon wafer in which a silicon wafer is doped with a pentavalent atom (for example, phosphorus (P), arsenic (As), and antimony (Sb)), and a p-type silicon wafer in which a silicon wafer is doped with a trivalent atom (for example, boron (B) and gallium (Ga)). The silicon of the silicon wafer may be, for example, any one of amorphous silicon, single crystal silicon, polycrystalline silicon, and polysilicon.

Among those, the treatment liquid is useful for a wafer consisting of a silicon-based material, such as a silicon wafer, a silicon carbide wafer, and a resin-based wafer including silicon (glass epoxy wafers).

The semiconductor substrate may have an insulating film on the wafer.

Specific examples of the insulating film include a silicon oxide film (for example, a silicon dioxide ($SiO_2$) film, a tetraethyl orthosilicate ($Si(OC_2H_5)_4$) film (TEOS film), a silicon nitride film (for example, silicon nitride ($Si_3N_4$), and silicon nitride carbide (SiNC)), and a low-dielectric-constant (Low-k) film (for example, a carbon-doped silicon oxide (SiOC) film and a silicon carbide (SiC) film).

The metal-containing substance is also preferably a metal-containing film (metal film).

Examples of the metal film contained in the semiconductor substrate include a metal film including at least one metal selected from the group consisting of tungsten (W) and cobalt (Co), for example, a film containing tungsten as a main component (tungsten-containing film), a film containing cobalt as a main component (cobalt-containing film), and a metal film composed of an alloy including one or more selected from the group consisting of W and Co.

It is also preferable that the semiconductor substrate has at least one of a metal film including tungsten and a metal film including cobalt.

Examples of the tungsten-containing film (metal film including tungsten as a main component) include a metal film consisting of only tungsten (tungsten metal film) and a metal film made of an alloy consisting of tungsten and another metal (tungsten alloy metal film).

Specific examples of the tungsten alloy metal film include a tungsten-titanium alloy metal film (WTi alloy metal film), and a tungsten-cobalt alloy metal film (WCo alloy metal film).

The tungsten-containing film is used, for example, as a barrier metal or a connection part between a via and a wiring line.

Examples of the cobalt-containing film (metal film including cobalt as a main component) include a metal film consisting of only metal cobalt (cobalt metal film), and a metal film (cobalt alloy metal film) made of an alloy consisting of metal cobalt and another metal.

Specific examples of the cobalt alloy metal film include a metal film made of an alloy consisting of one or more metals selected from titanium (Ti), chromium (Cr), iron (Fe), nickel (Ni), molybdenum (Mo), palladium (Pd), tantalum (Ta), and tungsten (W), and cobalt. More specific examples of the cobalt alloy metal film include a cobalt-titanium alloy metal film (CoTi alloy metal film), a cobalt-chromium alloy metal film (CoCr alloy metal film), a cobalt-iron alloy metal film (CoFe alloy metal film), a cobalt-nickel alloy metal film (CoNi alloy metal film), a cobalt-molybdenum alloy metal film (CoMo alloy metal film), a cobalt-palladium alloy metal film (CoPd alloy metal film), a cobalt-tantalum alloy metal film (CoTa alloy metal film), and a cobalt-tungsten alloy metal film (CoW alloy metal film).

The treatment liquid is useful for a substrate having a cobalt-containing film. Among the cobalt-containing films, the cobalt metal film is often used as the wiring line film, and the cobalt alloy metal film is often used as the barrier metal.

It is also preferable that the semiconductor substrate has a copper-containing film (a metal film including copper as a main component).

Examples of the copper-containing film include a wiring line film consisting of only metal copper (copper wiring line film), and a wiring line film made of an alloy consisting of metal copper and another metal (copper alloy wiring line film).

Specific examples of the copper alloy wiring line film include a wiring line film made of an alloy consisting of one or more metals selected from aluminum (Al), titanium (Ti), chromium (Cr), manganese (Mn), tantalum (Ta), and tungsten (W), and copper. More specific examples of the copper alloy wiring line film include a copper-aluminum alloy wiring line film (CuAl alloy wiring line film), a copper-titanium alloy wiring line film (CuTi alloy wiring line film), a copper-chromium alloy wiring line film (CuCr alloy wiring line film), a copper-manganese alloy wiring line film (CuMn alloy wiring line film), a copper-tantalum alloy wiring line film (CuTa alloy wiring line film), and a copper-tungsten alloy wiring line film (CuW alloy wiring line film).

In addition, the treatment liquid has at least a copper-containing wiring line film and a metal film (cobalt barrier metal) which is composed of only metallic cobalt and is a barrier metal of the copper-containing wiring line film, on an upper part of a wafer constituting a semiconductor substrate, and the treatment liquid is used to clean a substrate in which a copper-containing wiring line film and a cobalt barrier metal are in contact with each other on a surface of the substrate in some cases.

A method for forming the insulating film, a tungsten-containing film, a cobalt-containing film, or the like on a wafer constituting a semiconductor substrate is not particularly limited as long as it is a method usually performed in this field.

Examples of a method of forming an insulating film include a method in which a wafer constituting a semiconductor substrate is subjected to a heat treatment in the presence of an oxygen gas to form a silicon oxide film, and then a gas of silane and ammonia is introduced thereto to form a silicon nitride film by a chemical vapor deposition (CVD) method.

Examples of the method for forming a tungsten-containing film and a cobalt-containing film include a method in which a circuit is formed on a wafer having an insulating film by a known method such as a resist, and then a tungsten-containing film and a cobalt-containing film are formed by a method such as plating and a CVD method.

<CMP Treatment>

The CMP treatment is a treatment in which a surface of a substrate having a metal wiring line film, a barrier metal, and an insulating film is flattened by a combined action of a chemical action using a polishing slurry including polishing fine particles (abrasive grains) and mechanical polishing.

A surface of the semiconductor substrate which has been subjected to the CMP treatment may have impurities remaining thereon, such as abrasive grains (for example, silica and alumina) used in the CMP treatment, a polished metal wiring line film, and metal impurities (metal residue) derived from the barrier metal. In addition, an organic residue derived from the CMP treatment liquid used in the CMP treatment remains in some cases. For example, since these impurities may short-circuit the wiring lines and deteriorate the electrical characteristics of the semiconductor substrate, the semiconductor substrate which has been subjected to the CMP treatment is subjected to a cleaning treatment for removing these impurities from the surface.

Specific examples of the semiconductor substrate which has been subjected to the CMP treatment include the substrate which has been subjected to a CMP treatment, described in Vol. 84, No. 3, 2018, but the present invention is not limited thereto.

<Method for Cleaning Semiconductor Substrate>

A method for cleaning a semiconductor substrate only needs to include a cleaning step of cleaning a semiconductor substrate which has been subjected to a CMP treatment, using the treatment liquid. It is also preferable that the method for cleaning a semiconductor substrate includes a step of applying a diluted treatment liquid to a semiconductor substrate which has been subjected to a CMP treatment to perform cleaning (cleaning step).

Furthermore, as will be described later, the cleaning step is carried out only once or twice or more. In addition, at least one of the cleaning steps performed only once or twice or more times is a cleaning step using the treatment liquid produced by the production method of the embodiment of the present invention. As long as this requirement is satisfied, the treatment liquid referred to in the description of the following cleaning step may be the treatment liquid produced by the production method of the embodiment of the present invention or the above-mentioned second treatment liquid.

The cleaning step of cleaning a semiconductor substrate using a treatment liquid is not particularly limited as long as it is a known method to be performed on a semiconductor substrate which has been subjected to a CMP treatment, and cleaning in any of modes usually performed in this field, such as scrub cleaning in which a cleaning member such as a brush is physically brought into contact with a surface of the semiconductor substrate while supplying a treatment liquid to a semiconductor substrate, thereby removing residues; an immersion mode in which a semiconductor substrate is immersed in a treatment liquid; a spinning (dropping) mode in which a treatment liquid is dropped while rotating a semiconductor substrate; and a spray mode in which a treatment liquid is sprayed, may be adopted as appropriate. In the immersion type cleaning, it is preferable to subject the treatment liquid in which the semiconductor substrate is immersed to an ultrasonic treatment from the viewpoint that impurities remaining on a surface of the semiconductor substrate can be further reduced.

As a method for cleaning a semiconductor substrate in the cleaning step, either a single-wafer method or a batch method may be adopted. The single-wafer method is generally a method of treating semiconductor substrates one by one, and the batch method is generally a method of treating a plurality of semiconductor substrates at the same time.

The temperature of the treatment liquid used for cleaning a semiconductor substrate in the cleaning step is not particularly limited as long as it is a temperature usually used in this field. Cleaning is often performed at room temperature (about 25° C.), but any temperature can be selected in order to improve cleaning properties and/or suppress a damage to members. For example, the temperature of the treatment liquid is preferably 10° C. to 60° C., and more preferably 15° C. to 50° C.

The cleaning time in cleaning step cannot be unequivocally determined since it depends on types, contents, and the like of the components included in the treatment liquid, but practically, the cleaning time is preferably 10 seconds to 2 minutes, more preferably 20 seconds to 1 minute and 30 seconds, and still more preferably 30 seconds to 1 minute.

The supply amount (supply rate) of the treatment liquid in the cleaning step is not particularly limited, but is preferably 50 to 5,000 mL/min, and more preferably 500 to 2,000 mL/min.

In the cleaning step, a mechanical stirring method may be used in order to further improve the cleaning ability of the treatment liquid.

Examples of the mechanical stirring method include a method of circulating a treatment liquid on a semiconductor substrate, a method of flowing or spraying a treatment liquid on a semiconductor substrate, and a method of stirring a treatment liquid with an ultrasonic or a megasonic.

The cleaning step may be carried out only once or may be carried out twice or more times. In a case where the cleaning step is carried out twice or more times, the same method may be repeated or different methods may be combined.

In a case where the cleaning step is carried out only once, the treatment liquid used in the cleaning step is a treatment liquid produced by the manufacturing method of the embodiment of the present invention.

In a case where the cleaning step is carried out twice or more times, the treatment liquid used in each time may be different.

In a case where the cleaning step is carried out twice or more times, at least one of the cleaning steps may be a cleaning step using a treatment liquid produced by the production method of the embodiment of the present invention.

For example, a cleaning step using the above-mentioned second treatment liquid may be carried out before and/or after (preferably after) the cleaning step using a treatment liquid produced by the production method of the embodiment of the present invention.

More specifically, for example, a method in which a cleaning step using a treatment liquid produced by the production method of the embodiment of the present invention is carried out as a first-stage cleaning step, and a cleaning step using the above-mentioned second treatment liquid is carried out as a second-stage cleaning step may be mentioned.

After cleaning the semiconductor substrate (cleaning step which is carried out once or twice or more times), a step of rinsing and cleaning the semiconductor substrate with a solvent (hereinafter referred to as a "rinsing step") may be performed.

The rinsing step is preferably a step which is performed continuously subsequently after the cleaning step for the semiconductor substrate, and involves performing rinsing with a rinsing solvent (rinsing liquid) over 5 seconds to 5 minutes. The rinsing step may be performed using the above-mentioned mechanical stirring method.

Examples of the rinsing solvent include water (preferably deionized (DI) water), methanol, ethanol, isopropyl alcohol, N-methylpyrrolidinone, γ-butyrolactone, dimethyl sulfoxide, ethyl lactate, and propylene glycol monomethyl ether acetate. In addition, an aqueous rinsing liquid having a pH of more than 8 (aqueous ammonium hydroxide which has been diluted, and the like) may be used.

As a method of bringing the rinsing solvent into contact with the semiconductor substrate, the above-mentioned method of bringing a treatment liquid into contact with a semiconductor substrate can be similarly applied.

In addition, after the rinsing step, a drying step of drying the semiconductor substrate may be performed.

Examples of the drying method include, but not limited to, a spin drying method, examples of the drying method include a spin drying method, a method of flowing a dry gas onto a semiconductor substrate, a method of heating a substrate by a heating means such as a hot plate and an infrared lamp, a Marangoni drying method, a Rotagoni drying method, an isopropyl alcohol (IPA) drying method, and any combinations thereof.

EXAMPLES

Hereinbelow, the present invention will be described in more detail with reference to Examples. The materials, the amounts of the materials to be used, the proportions, and the like shown in the Examples below may be modified as appropriate as long as the modifications do not depart from the spirit of the present invention. Therefore, the scope of the present invention should not be construed as being limited to Examples shown below.

In the following Examples, a pH was measured at 25° C. using a pH meter (manufactured by HORIBA, Ltd., model "F-74") in accordance with JIS Z8802-1984.

Furthermore, in the production of treatment liquids of Examples and Comparative Examples, all of handling of a container, production of a liquid, filling, storage, and analytical measurement were performed in a clean room satisfying a level of ISO Class 2 or lower.

[Raw Materials for Object to be Purified]

The compounds used to manufacture an object to be purified to be subjected to tests are shown below. Furthermore, as various components used in Examples, those all classified into a semiconductor grade or a high-purity grade equivalent thereto were used. In addition, the compounds used to manufacture the second treatment liquid which will be described below are also shown below.

[Surfactant]

In the following surfactants, an anionic system A and an anionic system B are anionic surfactants, a cationic system A to a cationic system E are cationic surfactants, and the other surfactants are nonionic surfactants.

$C_{12}H_{25}O(EO)_nH$: $C_{12}H_{25}O(CH_2CH_2O)_nH$ (n is 6, 20, 30, or 50)

Anionic A: $C_{12}H_{25}O(CH_2CH_2O)_{10}PO_3H_2$

Anionic B: $C_{12}H_{25}O(CH_2CH_2O)_7CH_2COOH$.

Nonionic X: Compounds shown below

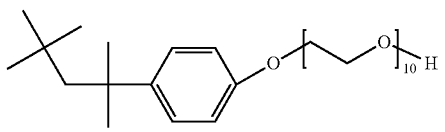

Cationic A: Benzethonium chloride

Cationic B: Kohtamin 60W (manufactured by Kao Corporation)

Cationic C: Pionin B-0012-H (manufactured by Takemoto Oil & Fat Co., Ltd.)

Cationic D: Pionin B-251 (manufactured by Takemoto Oil & Fat Co., Ltd.)

Cationic E: Surflon S-221 (manufactured by AGC Seimi Chemical Co., Ltd.)

Nonionic Y: Blaunon S-204 (manufactured by Aoki Oil Industrial Co., Ltd.)

Nonionic Z: Amit 320 (manufactured by Kao Corporation)

[Chelating Agent]

Adipic acid
Succinic acid
Malonic acid
Oxalic acid
Citric acid
Phthalic acid
Trimellitic acid
Pyromellitic acid
DTPA: Diethylenetriaminepentaacetic acid
HEDP: 1-Hydroxyethane-1,1-diphosphonic acid

[Amine Compound]

MEA: Monoethanolamine
Tris: Trishydroxymethylaminomethane
2-Aminopyrimidine
2,4-Diaminopyrimidine
2,4,6-Triaminopyrimidine
2,6-Dihydroxypyridine
Uracil
Cytosine

[Additive]

Polyacrylic acid (weight-average molecular weight: 6,000)
BYK2012: DISPERBYK-2012 (manufactured by BYK-Chemie)
BYK2013: DISPERBYK-2013 (manufactured by BYK-Chemie)
DL-30 (manufactured by Nippon Shokubai Co., Ltd.)
YS-100 (manufactured by Nippon Shokubai Co., Ltd.)
HL-415 (manufactured by Nippon Shokubai Co., Ltd.)
Aron-SD10 (manufactured by Toagosei Co., Ltd.)
P9300: DEQUEST P9300 (manufactured by Thermophos Deutschland, DE)
Periodic acid
Sorbic acid
L-Histidine
L-Arginine
L-Lysine

[pH Adjusting Agent and Water]

In addition, in the manufacture of an object to be purified (or a second treatment liquid which will be described later), either potassium hydroxide (KOH) or sulfuric acid ($H_2SO_4$), or commercially available ultrapure water (manufactured by FUJIFILM Wako Pure Chemical Corporation) was used as a pH adjusting agent.

Furthermore, the content of the pH adjusting agent (potassium hydroxide or sulfuric acid) was 2% by mass or less with respect to the total mass of the object to be purified (or the second treatment liquid which will be described later) in any of Examples or Comparative Examples.

Examples 1 to 44 and Comparative Example 1

[Production Test of Treatment Liquid]

[Filter Medium]

Materials for a filter medium which can be contained in a filter used in the test are shown below.

Polyallyl sulfonic acid
Nylon
Perfluoroalkoxy alkane which has been subjected to a hydrophilization treatment
Polytetrafluoroethylene which has been subjected to a hydrophilization treatment
Polyethylene which has been subjected to a hydrophilization treatment
Polyvinylidene fluoride which has been subjected to a hydrophilization treatment
Untreated PTFE: Polytetrafluoroethylene which has not been subjected to a hydrophilization treatment The hydrophilization treatment in a case where there is a description that "the hydrophilization treatment was carried out" in each of the materials was carried out by bringing plasma formed using an oxygen gas into contact with each material.

[Test Procedure]

<Preparation of Object to be Purified>

The above-mentioned respective components were mixed so as to have the contents and the pH as shown in Table 1 shown in the latter part, thereby obtaining an object to be purified to be used in each test. For example, in the object to be purified of Example 1, 1% by mass of a chelating agent (adipic acid), 0.1% by mass of a surfactant (Triton X-100), and 3% by mass of an amine compound (MEA), with respect to the total mass of the object to be purified, were included, and a pH adjusting agent (potassium hydroxide or sulfuric acid) in an amount so that the pH of the object to be purified was 6 was also included, with a balance of water.

<Production of Treatment Liquid>

10 L of each of the obtained object to be purified was subjected to circulation filtration, using a filter (only a filter A, or the filter A and a filter B) having a filter medium as shown in the table, to obtain a treatment liquid.

Here, in Examples in which both the filter A and the filter B were used, the object to be purified was passed through the filter A and the filter B in this order, the object to be purified after being filtered by the filter B was circulated to the upstream side of the filter A and subjected to circulation filtration in which the filtration was carried out again by the filter A and the filter B in this order.

The circulation filtration was carried out so that the number of circulations was 3.

Furthermore, the filter (the filter A and/or the filter B) used in the test was used in the test after passing isopropyl alcohol (IPA) therethrough in advance and substituting IPA with pure water.

For the obtained treatment liquid, the number of particles (LPC) having a diameter of 100 nm (0.1 μm) or more included in 10 L of the obtained treatment liquid was counted using an in-liquid particle counter.

The filterability of Examples or Comparative Examples was classified as shown below, based on the measured LPC and the smoothness during circulation filtration, with respect to the obtained treatment liquid.

AAAA: Circulation filtration was completed without any problem, and the number of LPC's of the treatment liquid was less than 10.

AAA: Circulation filtration was completed without any problem, and the number of LPC's of the treatment liquid was 10 or more and less than 20.

AA: Circulation filtration was completed without any problem, and the number of LPC's of the treatment liquid was 20 or more and less than 30.

A: Circulation filtration was completed without any problem, and the number of LPC's of the treatment liquid was 30 or more and less than 50.

B: Circulation filtration was completed without any problem, and the number of LPC's of the treatment liquid was 50 or more and less than 100.

C: Circulation filtration was completed without any problem, and the number of LPC's of the treatment liquid was 100 or more and less than 300.

D: A short time after the start of the circulation filtration, inclusion of bubbles was generated by bubbles derived from the object to be purified, and the filtration was terminated in the middle. (The treatment liquid could not be obtained)

Furthermore, the number of particles (LPC) having a diameter of 100 nm (0.1 μm) or more included in 10 L of each object to be purified before filtration was 1 to 100.

[Results]

The formulation of the object to be purified, the type of the filter used, the filtration pressure, and the evaluation results (filterability) in each Example or Comparative Example are shown in the following table.

Furthermore, the pH adjusting agent and water are not described in the table.

Each object to be purified includes a pH adjusting agent (one of potassium hydroxide and sulfuric acid) in an amount required to adjust the pH of each object to be purified as described in the "pH" column of the table. Furthermore, in any of the objects to be purified, the content of the pH adjusting agent was 2% by mass or less with respect to the total mass of the object to be purified.

In the object to be purified, the balance other than each component and the pH adjusting agent shown in the table is water.

In the table, the "Amine compound/surfactant" column shows the mass ratio of the content of the amine compound to the content of the surfactant.

TABLE 1

| | Formulation of object to be purified (water and pH adjusting agent not described) | | | | | | | | | |
|---|---|---|---|---|---|---|---|---|---|---|
| | Chelating agent | | Surfactant | | Amine compound | | Additive | | | Amine |
| Table 1 (1) | Type | Amount (%) | Type | Amount (%) | Type | Amount (%) | Type | Amount (%) | pH | compound/ Surfactant |
| Example 1 | Adipic acic | 1 | Nonionic X | 0.1 | MEA | 3 | | | 6 | 30 |
| Example 2 | Adipic acid | 1 | Nonionic X | 0.1 | MEA | 3 | | | 7 | 30 |
| Example 3 | Adipic acid | 1 | Nonionic X | 0.1 | MEA | 3 | | | 8 | 30 |
| Example 4 | Adipic acid | 1 | Nonionic X | 0.1 | MEA | 3 | | | 9 | 30 |
| Example 5 | Adipic acid | 1 | Nonionic X | 0.1 | MEA | 3 | | | 10 | 30 |
| Example 6 | Adipic acic | 1 | Nonionic X | 0.1 | MEA | 3 | | | 11 | 30 |
| Example 7 | Adipic acid | 1 | Nonionic X | 0.1 | MEA | 3 | | | 12 | 30 |
| Example 8 | Adipic acid | 1 | Nonionic X | 0.1 | MEA | 3 | | | 13 | 30 |
| Example 9 | Adipic acid | 1 | Nonionic X | 0.1 | MEA | 3 | | | 14 | 30 |
| Example 10 | Adipic acid | 1 | Nonionic X | 0.1 | MEA | 3 | | | 10 | 30 |
| Example 11 | Adipic acid | 1 | Nonionic X | 0.1 | MEA | 3 | | | 10 | 30 |
| Example 12 | Adipic acid | 1 | Nonionic X | 0.1 | MEA | 3 | | | 10 | 30 |
| Example 13 | Adipic acid | 1 | Nonionic X | 0.1 | MEA | 3 | | | 10 | 30 |
| Example 14 | Adipic acid | 1 | Nonionic X | 0.1 | MEA | 3 | | | 10 | 30 |
| Example 15 | Adipic acid | 1 | $C_{12}H_{25}O(EO)_nH$ n = 50 | 0.1 | MEA | 3 | | | 10 | 30 |

TABLE 2

| | Filter used | | | | |
|---|---|---|---|---|---|
| | Filter A | | Filter B | | |
| Table 1 (1) (Continued) | Filter medium (pore nm) | Filtration pressure (MPa) | Filter medium (pore nm) | Filtration pressure (MPa) | Results Filterability |
| Example 1 | Polyallyl sulfonic acid (10 nm) | 0.2 to 0.4 | | | C |
| Example 2 | Polyallyl sulfonic acid (10 nm) | 0.2 to 0.4 | | | B |
| Example 3 | Polyallyl sulfonic acid (10 nm) | 0.2 to 0.4 | | | A |
| Example 4 | Polyallyl sulfonic acid (10 nm) | 0.2 to 0.4 | | | A |
| Example 5 | Polyallyl sulfonic acid (10 nm) | 0.2 to 0.4 | | | A |

TABLE 2-continued

| Table 1 (1) (Continued) | Filter used<br>Filter A<br>Filter medium (pore nm) | Filtration pressure (MPa) | Filter B<br>Filter medium (pore nm) | Filtration pressure (MPa) | Results Filterability |
|---|---|---|---|---|---|
| Example 6 | Polyallyl sulfonic acid (10 nm) | 0.2 to 0.4 | | | A |
| Example 7 | Polyallyl sulfonic acid (10 nm) | 0.2 to 0.4 | | | A |
| Example 8 | Polyallyl sulfonic acid (10 nm) | 0.2 to 0.4 | | | B |
| Example 9 | Polyallyl sulfonic acid (10 nm) | 0.2 to 0.4 | | | C |
| Example 10 | Nylon (10 nm) | 0.2 to 0.4 | | | B |
| Example 11 | Perfluoroalkoxy alkane which has been subjected to hydrophilization treatment (10 nm) | 0.2 to 0.4 | | | B |
| Example 12 | Polytetrafluoroethylene which has been subjected to hydrophilization treatment (10 nm) | 0.2 to 0.4 | | | B |
| Example 13 | Polyethylene which has been subjected to hydrophilization treatment (10 nm) | 0.2 to 0.4 | | | C |
| Example 14 | Polyvinylidene fluoride which has been subjected to hydrophilization treatment (10 nm) | 0.2 to 0.4 | | | C |
| Example 15 | Polyallyl sulfonic acid (10 nm) | 0.2 to 0.4 | | | C |

TABLE 3

| Formulation of object to be purified (water and pH adjusting agent not described) | | | | | | | | | | |
|---|---|---|---|---|---|---|---|---|---|---|
| | Chelating agent | | Surfactant | | Amine compound | | Additive | | | Amine |
| Table 1 (2) | Type | Amount (%) | Type | Amount (%) | Type | Amount (%) | Type | Amount (%) | pH | compound/ Surfactant |
| Example 16 | Adipic acid | 1 | $C_{12}H_{25}O(EO)_nH$ n = 30 | 0.1 | MEA | 3 | | | 10 | 30 |
| Example 17 | Adipic acid | 1 | $C_{12}H_{25}O(EO)_nH$ n = 20 | 0.1 | MEA | 3 | | | 10 | 30 |
| Example 18 | Adipic acid | 1 | $C_{12}H_{25}O(EO)_nH$ n = 6 | 0.1 | MEA | 3 | | | 10 | 30 |
| Example 19 | Adipic acid | 1 | Nonionic X | 0.001 | MEA | 5 | | | 10 | 5,000 |
| Example 20 | Adipic acid | 1 | Nonionic X | 0.001 | MEA | 3 | | | 10 | 3,000 |
| Example 21 | Adipic acid | 1 | Nonionic X | 0.003 | MEA | 3 | | | 10 | 1,000 |
| Example 22 | Adipic acid | 1 | Nonionic X | 0.01 | MEA | 3 | | | 10 | 300 |
| Example 23 | Adipic acid | 1 | Nonionic X | 1 | MEA | 3 | | | 10 | 3 |
| Example 24 | Adipic acid | 1 | Nonionic X | 1 | MEA | 1 | | | 10 | 1 |
| Example 25 | Adipic acid | 1 | Nonionic A | 0.1 | MEA | 3 | | | 10 | 30 |
| Example 26 | Adipic acid | 1 | Nonionic B | 0.1 | MEA | 3 | | | 10 | 30 |
| Example 27 | Adipic acid | 1 | Nonionic X | 0.1 | MEA | 3 | | | 10 | 30 |
| Example 28 | Adipic acid | 1 | Nonionic X | 0.1 | MEA | 3 | | | 10 | 30 |
| Example 29 | Adipic acid | 1 | Nonionic X | 0.1 | MEA | 3 | | | 10 | 30 |

TABLE 3-continued

| Table 1 (2) | Chelating agent Type | Chelating agent Amount (%) | Surfactant Type | Surfactant Amount (%) | Amine compound Type | Amine compound Amount (%) | Additive Type | Additive Amount (%) | pH | Amine compound/ Surfactant |
|---|---|---|---|---|---|---|---|---|---|---|
| | Formulation of object to be purified (water and pH adjusting agent not described) | | | | | | | | | |
| Example 30 | Adipic acid | 1 | Nonionic X | 0.1 | MEA | 3 | | | 10 | 30 |

TABLE 4

| Table 1 (2) (Continued) | Filter used | | | | |
|---|---|---|---|---|---|
| | Filter A | | Filter B | | |
| | Filter medium (pore nm) | Filtration pressure (MPa) | Filter medium (pore nm) | Filtration pressure (MPa) | Results Filterability |
| Example 16 | Polyallyl sulfonic acid (10 nm) | 0.2 to 0.4 | | | B |
| Example 17 | Polyallyl sulfonic acid (10 nm) | 0.2 to 0.4 | | | A |
| Example 18 | Polyallyl sulfonic acid (10 nm) | 0.2 to 0.4 | | | A |
| Example 19 | Polyallyl sulfonic acid (10 nm) | 0.2 to 0.4 | | | C |
| Example 20 | Polyallyl sulfonic acid (10 nm) | 0.2 to 0.4 | | | B |
| Example 21 | Polyallyl sulfonic acid (10 nm) | 0.2 to 0.4 | | | A |
| Example 22 | Polyallyl sulfonic acid (10 nm) | 0.2 to 0.4 | | | A |
| Example 23 | Polyallyl sulfonic acid (10 nm) | 0.2 to 0.4 | | | A |
| Example 24 | Polyallyl sulfonic acid (10 nm) | 0.2 to 0.4 | | | B |
| Example 25 | Polyallyl sulfonic acid (10 nm) | 0.2 to 0.4 | | | A |
| Example 26 | Polyallyl sulfonic acid (10 nm) | 0.2 to 0.4 | | | A |
| Example 27 | Polyallyl sulfonic acid (10 nm) | 0.05 to 0.2 | | | A |
| Example 28 | Polyallyl sulfonic acid (10 nm) | 0.01 or more and less than 0.05 | | | B |
| Example 29 | Polyallyl sulfonic acid (10 nm) | More than 0.4 and 0.6 or less | | | B |
| Example 30 | Polyallyl sulfonic acid (20 nm) | 0.2 to 0.4 | | | A |

TABLE 5

| Table 1 (3) | Chelating agent Type | Chelating agent Amount (%) | Surfactant Type | Surfactant Amount (%) | Amine compound Type | Amine compound Amount (%) | Additive Type | Additive Amount (%) | pH | Amine compound/ Surfactant |
|---|---|---|---|---|---|---|---|---|---|---|
| | Formulation of object to be purified (water and pH adjusting agent not described) | | | | | | | | | |
| Example 31 | Adipic acid | 1 | Nonionic X | 0.1 | MEA | 3 | | | 10 | 30 |
| Example 32 | Adipic acid | 1 | Nonionic X | 0.1 | MEA | 3 | | | 10 | 30 |
| Example 33 | Adipic acid | 1 | Nonionic X | 0.1 | MEA | 3 | | | 10 | 30 |
| Example 34 | Adipic acid | 1 | Nonionic X | 0.1 | MEA | 3 | | | 10 | 30 |

TABLE 5-continued

| Table 1 (3) | Formulation of object to be purified (water and pH adjusting agent not described) | | | | | | | | | |
|---|---|---|---|---|---|---|---|---|---|---|
| | Chelating agent | | Surfactant | | Amine compound | | Additive | | | Amine |
| | Type | Amount (%) | Type | Amount (%) | Type | Amount (%) | Type | Amount (%) | pH | compound/ Surfactant |
| Example 35 | Adipic acid | 1 | Nonionic X | 0.1 | MEA | 3 | Polyacrylic acid (Mw = 6,000) | 1 | 10 | 30 |
| Example 36 | Adipic acid | 1 | Nonionic X | 0.1 | MEA | 3 | Periodic acid | 1 | 10 | 30 |
| Example 37 | Adipic acid | 0.01 | Nonionic X | 0.1 | MEA | 3 | | | 10 | 30 |
| Example 38 | Adipic acid | 0.5 | Nonionic X | 0.1 | MEA | 3 | | | 10 | 30 |
| Example 39 | Adipic acid | 3 | Nonionic X | 0.1 | MEA | 3 | | | 10 | 30 |
| Example 40 | Succinic acid | 1 | Nonionic X | 0.1 | MEA | 3 | | | 10 | 30 |
| Example 41 | Malonic acid | 1 | Nonionic X | 0.1 | MEA | 3 | | | 10 | 30 |
| Example 42 | Oxalic acid | 1 | Nonionic X | 0.1 | MEA | 3 | | | 10 | 30 |
| Example 43 | DTPA | 0.1 | Nonionic X | 0.1 | MEA | 3 | | | 10 | 30 |
| Example 44 | HEDP | 0.1 | Nonionic | 0.1 | MEA | 3 | | | 10 | 30 |
| Comparative Example 1 | Adipic acid | 1 | Nonionic X | 0.1 | MEA | 3 | | | 11 | 30 |

TABLE 6

| Table 1 (3) (Continued) | Filter used | | | | Results |
|---|---|---|---|---|---|
| | Filter A | | Filter B | | |
| | Filter medium (pore nm) | Filtration pressure (MPa) | Filter medium (pore nm) | Filtration pressure (MPa) | Filterability |
| Example 31 | Polyallyl sulfonic acid (10 nm) | 0.2 to 0.4 | | | A |
| Example 32 | Nylon (10 nm) | 0.2 to 0.4 | Polyallyl sulfonic acid (2 nm) | 0.2 to 0.4 | AAA |
| Example 33 | Polyallyl sulfonic acid (10 nm) | 0.2 to 0.4 | Polyallyl sulfonic acid (2 nm) | 0.2 to 0.4 | AAAA |
| Example 34 | Untreated PTFE (50 nm) | 0.2 to 0.4 | Polyallyl sulfonic acid (2 nm) | 0.2 to 0.4 | AA |
| Example 35 | Polyallyl sulfonic acid (10 nm) | 0.2 to 0.4 | Polyallyl sulfonic acid (10 nm) | 0.2 to 0.4 | AA |
| Example 36 | Polyallyl sulfonic acid (10 nm) | 0.2 to 0.4 | Polyallyl sulfonic acid (10 nm) | 0.2 to 0.4 | AA |
| Example 37 | Polyallyl sulfonic acid (10 nm) | 0.2 to 0.4 | | | A |
| Example 38 | Polyallyl sulfonic acid (10 nm) | 0.2 to 0.4 | | | A |
| Example 39 | Polyallyl sulfonic acid (10 nm) | 0.2 to 0.4 | | | A |
| Example 40 | Polyallyl sulfonic acid (10 nm) | 0.2 to 0.4 | | | A |
| Example 41 | Polyallyl sulfonic acid (10 nm) | 0.2 to 0.4 | | | A |
| Example 42 | Polyallyl sulfonic acid (10 nm) | 0.2 to 0.4 | | | B |
| Example 43 | Polyallyl sulfonic acid (10 nm) | 0.2 to 0.4 | | | B |
| Example 44 | Polyallyl sulfonic acid (10 nm) | 0.2 to 0.4 | | | B |
| Comparative Example 1 | Untreated PTFE (10 nm) | 0.2 to 0.4 | Untreated PTFE (10 nm) | 0.2 to 0.4 | D |

As is clear from Table 1, it was confirmed that the production method of the embodiment of the present invention had good filterability.

In addition, from the viewpoint that the filterability is excellent, it was confirmed that the pH of the object to be purified is preferably 7 to 13, and more preferably 8 to 12 (see the results of Examples 1 to 9, and the like).

From the viewpoint that the filterability is more excellent, it was confirmed that n in the group represented by Formula (1) is preferably 3 to 30, and more preferably 6 to 20 (see the results of Examples 15 to 18, and the like).

From the viewpoint that the filterability is more excellent, it was confirmed that the object to be purified preferably includes an aliphatic carboxylic acid-based chelating agent having 3 or more carbon atoms (see the results of Examples 5, 37 to 44, and the like).

From the viewpoint that the filterability is more excellent, it was confirmed that the mass ratio of the content of the amine compound to the content of the surfactant in the object to be purified is preferably 1 to 3,000, and more preferably 2 to 1,000 (see the results of Examples 5, 19 to 24, and the like).

From the viewpoint that the filterability is more excellent, it was confirmed that the first filter medium preferably includes at least one selected from the group consisting of a nylon, a polyallyl sulfonic acid, a perfluoroalkoxy alkane which has been subjected to a hydrophilization treatment, and a polytetrafluoroethylene which has been subjected to a hydrophilization treatment, and more preferably includes the polyallyl sulfonic acid (see the results of Examples 5, 10 to 14, and the like).

From the viewpoint that the filterability is more excellent, it was confirmed that it is preferable to perform the filtration of the object to be purified using the first filter including the first filter medium and the second filter including the second filter medium (see the results of Examples 5 and 32 to 36, and the like).

From the viewpoint that the filterability is still more excellent, it was confirmed that it is preferable to perform the filtration of the object to be purified by setting the pore diameter of the second filter medium to be larger than the pore diameter of the first filter medium, and passing the object to be purified through the second filter and the first filter in this order to (see the results of Examples 33, 35, and 36, and the like).

From the viewpoint that the filterability is particularly excellent, it was confirmed that the second filter medium preferably includes at least one selected from the group consisting of a nylon and a polyallyl sulfonic acid, and more preferably includes the polyallyl sulfonic acid (see the results of Examples 32 to 34, and the like).

From the viewpoint that the filterability is even more excellent, it was confirmed that the filtration pressure is preferably from 0.05 MPa to 0.4 MPa (see the results of Examples 5, 28, and 29, and the like).

Examples 45 to 68

Further, a cleaning test was performed on a semiconductor substrate which had been subjected to a CMP treatment, using the manufactured treatment liquid.

[Tests]

[Production of Treatment Liquid]

A treatment liquid (treatment liquid of Example 1) was produced by the method mentioned above as Example 1.

[Production of Second Treatment Liquid]

A second treatment liquid used in each test was obtained by mixing the respective components in the table with water and a pH adjusting agent (potassium hydroxide or sulfuric acid) so that the content and the pH were as shown in Table 2 shown in the latter part. For example, in the second treatment liquid of Example 46, 3% by mass of a chelating agent (citrate), 4.75% by mass of an amine compound (Tris), and 0.05% by mass of sorbic acid, with respect to the total mass of the second treatment liquid, were included, and a pH adjusting agent (potassium hydroxide or sulfuric acid) in an amount so that the pH of the second treatment liquid was 6 was also included, with a balance of water.

Furthermore, in Example 45, the second treatment liquid was not used.

[Evaluation of Cleanability]

A cleaning performance (defect inhibition performance) in a case where a semiconductor substrate having a metal film which had been subjected to chemical mechanical polishing was cleaned, using the treatment liquids (the treatment liquid of Example 1 and the second treatment liquid) produced by the method was evaluated.

First, 1 L of the treatment liquid of Example 1 was fractioned and diluted 100-fold by volume with ultrapure water to prepare a sample of the diluted treatment liquid.

In addition, 1 L of the second treatment liquid of each Example was fractioned and diluted 100-fold by volume with ultrapure water to prepare a sample of the diluted second treatment liquid.

Furthermore, the pH of the diluted treatment liquid was 6 or more and less than 7.

In addition, the pH of the diluted second treatment liquid was equal to or higher than the pH of the second treatment liquid before dilution and less than 7 in any of Examples.

A wafer having a metal film consisting of tungsten (silicon wafer, diameter: 10 inches) on a surface thereof was polished, using FREX 300S-II (a polishing device, manufactured by Ebara Corporation) under the conditions of a polishing pressure of 2.0 psi, a polishing slurry feed rate of 0.28 ml/(min $cm^2$), and a polishing time of 60 seconds. As the polishing liquid, W2000 (product name, manufactured by Cabot Corporation) was used.

Then, scrub cleaning (a first-stage cleaning step) was carried out for 60 seconds, using the diluted treatment liquid of Example 1 whose temperature was adjusted to room temperature (23° C.), then scrub cleaning (a second-stage cleaning step) was carried out for 60 seconds, using any one of the diluted second treatment liquids of each Example, and a drying treatment was performed.

It should be noted that in Example 45, the step of cleaning using the second diluted treatment liquid was omitted.

The number of defects on the polished surface of the obtained wafer was detected, using a defect detection device, each defect was observed with a scanning electron microscope (SEM), and defect classification was performed. As necessary, the constituent elements were analyzed by an energy-dispersive X-ray spectroscopy device (EDAX) to specify the components.

As a result, the numbers of defects based on the metal residue (a residue containing a metal as a main component), defects based on an organic residue (a residue containing an organic substance as a main component), and defects based on the corrosion of tungsten (metal film), on the polished surface of the wafer, were each determined. The determined numbers of defects were classified according to the following categories, and the cleanability (defect inhibition property) in each Example was evaluated.

A: The number of target defects is 20 or less.

B: The number of target defects is more than 20 and 30 or less.

C: The number of target defects is more than 30 and 50 or less.

D: The number of target defects is more than 50.

[Results]

The formulation of the second treatment liquid (second treatment liquid before dilution) and the test results in each Example are shown in the following table.

Furthermore, the pH adjusting agent and water are not described in the table.

Each of the second treatment liquids includes a pH adjusting agent (one of potassium hydroxide and sulfuric acid) in an amount required to adjust the pH of each second treatment liquid as described in the "pH" column of the table. Furthermore, in any of the second treatment liquids, the content of the pH adjusting agent was 2% by mass or less with respect to the total mass of the second treatment liquid.

In the second treatment liquid, the balance other than each component and the pH adjusting agent shown in the table is water.

TABLE 7

| Table 2 | Treatment liquid used in first-stage cleaning step | Formulation of second treatment liquid (water and pH adjusting agent not described) | | | | | | | | | Results | | |
|---|---|---|---|---|---|---|---|---|---|---|---|---|---|
| | | Chelating agent | | Surfactant | | Amine compound | | Additive | | | Defects based on metal residue | Defects based on organic residue | Defects based on corrosion of metal film surface |
| | | Type | Amount (%) | Type | Amount (%) | Type | Amount (%) | Type | Amount (%) | pH | | | |
| Example 45 | Example 1 | | | | | | | | | | C | C | C |
| Example 46 | Example 1 | Citric acid | 3 | | | Tris | 4.75 | Sorbic acid | 0.05 | 6 | A | A | C |
| Example 47 | Example 1 | Citric acid<br>HEDP | 3<br>1 | | | Tris | 4.75 | Sorbic acid | 0.05 | 6 | A | A | C |
| Example 48 | Example 1 | Citric acid | 3 | Cationic A | 0.5 | Tris | 4.75 | Sorbic acid | 0.05 | 6 | B | A | B |
| Example 49 | Example 1 | Citric acid | 3 | Cationic B | 0.5 | Tris | 4.75 | Sorbic acid | 0.05 | 6 | B | A | B |
| Example 50 | Example 1 | Citric acid | 3 | Cationic C | 0.5 | Tris | 4.75 | Sorbic acid | 0.05 | 6 | B | A | B |
| Example 51 | Example 1 | Citric acid | 3 | Cationic D | 0.5 | Tris | 4.75 | Sorbic acid | 0.05 | 6 | B | A | B |
| Example 52 | Example 1 | Citric acid | 3 | Nonionic Y | 0.5 | Tris | 4.75 | Sorbic acid | 0.05 | 6 | B | A | B |
| Example 53 | Example 1 | Citric acid | 3 | Cationic E | 0.5 | Tris | 4.75 | Sorbic acid | 0.05 | 6 | B | A | B |
| Example 54 | Example 1 | Citric acid | 3 | Nonionic Z | 0.5 | Tris | 4.75 | Sorbic acid | 0.05 | 6 | B | A | B |
| Example 55 | Example 1 | Citric acid | 3 | Cationic A | 0.5 | Tris | 4.75 | Sorbic acid | 0.05 | 3.5 | B | A | A |
| Example 56 | Example 1 | Citric acid | 3 | Cationic B | 0.5 | Tris | 4.75 | Sorbic acid | 0.05 | 3.5 | B | A | A |
| Example 57 | Example 1 | Citric acid | 3 | Cationic C | 0.5 | Tris | 4.75 | Sorbic acid | 0.05 | 3.5 | B | A | A |
| Example 58 | Example 1 | Citric acid | 3 | Cationic D | 0.5 | Tris | 4.75 | Sorbic acid | 0.05 | 3.5 | B | A | A |
| Example 59 | Example 1 | Citric acid | 3 | Nonionic Y | 0.5 | Tris | 4.75 | Sorbic acid | 0.05 | 3.5 | B | A | A |
| Example 60 | Example 1 | Citric acid | 3 | Cationic E | 0.5 | Tris | 4.75 | Sorbic acid | 0.05 | 3.5 | B | A | A |
| Example 61 | Example 1 | Citric acid | 3 | Nonionic Z | 0.5 | Tris | 4.75 | Sorbic acid | 0.05 | 3.5 | B | A | A |
| Example 62 | Example 1 | Citric acid | 3 | | | Tris | 4.75 | Sorbic acid<br>BYK2012 | 0.05<br>1 | 6 | B | A | A |
| Example 63 | Example 1 | Citric acid | 3 | | | Tris | 4.75 | Sorbic acid<br>BYK2013 | 0.05<br>1 | 6 | B | A | A |
| Example 64 | Example 1 | Citric acid | 3 | | | Tris | 4.75 | Sorbic acid<br>DL-30 | 0.05<br>0.2 | 6 | A | A | B |
| Example 65 | Example 1 | Citric acid | 3 | | | Tris | 4.75 | Sorbic acid<br>YS-100 | 0.05<br>0.2 | 6 | A | A | B |
| Example 66 | Example 1 | Citric acid | 3 | | | Tris | 4.75 | Sorbic acid<br>HL-415 | 0.05<br>0.2 | 6 | A | A | B |
| Example 67 | Example 1 | Citric acid | 3 | | | Tris | 4.75 | Sorbic acid<br>P9300 | 0.05<br>0.2 | 6 | A | A | B |
| Example 68 | Example 1 | Citric acid | 3 | | | Tris | 4.75 | Sorbic acid<br>BYK2012<br>YS-100 | 0.05<br>1<br>0.2 | 6 | A | A | A |

From the results of Examples 45 to 68, it was confirmed that the treatment liquid produced by the production method of the embodiment of the present invention has good cleanability (defect inhibition property) in a case of being applied to a semiconductor substrate which had been subjected to a chemical mechanical polishing (CMP) treatment.

Above all, it has been confirmed that better cleanability can be realized by performing cleaning with the treatment liquid produced by the production method of the embodiment of the present invention, and cleaning with the second treatment liquid.

In addition, it was confirmed that in a case where the second treatment liquid includes two or more kinds of polymers, even better cleanability can be realized (see the results of Example 68, and the like).

Examples 69 to 101

Further, a cleaning test was performed on a semiconductor substrate which had been subjected to a CMP treatment, using the manufactured treatment liquid.

[Tests]

[Production of Treatment Liquid]

A treatment liquid (treatment liquid of Example 1) was produced by the method mentioned above as Example 1.

[Production of Second Treatment Liquid]

A second treatment liquid used in each test was produced by mixing the respective components in the table with water and a pH adjusting agent (potassium hydroxide or sulfuric acid) so that the content and the pH were as shown in Table 3 shown in the latter part. For example, in the second treatment liquid of Example 46, 3% by mass of a chelating agent (citrate), 4.2% by mass of an amine compound (Tris), 0.05% by mass of sorbic acid, and 1.5% by mass of an amino acid (L-histidine), with respect to the total mass of the second treatment liquid, were included, and a pH adjusting agent (potassium hydroxide or sulfuric acid) in an amount so that the pH of the second treatment liquid was 6 was also included, with a balance of water.

[Evaluation of Cleanability]

A cleaning performance (defect inhibition performance) in a case where a semiconductor substrate having a metal film which had been subjected to chemical mechanical polishing was cleaned according to the methods described in Examples 45 to 68, using the treatment liquids (the treatment liquid of Example 1 and the second treatment liquid) produced by the method, was evaluated.

Furthermore, the pH of the diluted second treatment liquid obtained by fractioning 1 L of the second treatment liquid of each Example, followed by diluting 100-fold by volume with ultrapure water, was equal to or higher than the pH of the second treatment liquid before dilution and less than 7 in any of Examples.

[Results]

The formulation of the second treatment liquid (second treatment liquid before dilution) and the test results in each Example are shown in the following table.

Furthermore, the pH adjusting agent and water are not described in the table.

Each of the second treatment liquids includes a pH adjusting agent (one of potassium hydroxide and sulfuric acid) in an amount required to adjust the pH of each second treatment liquid as described in the "pH" column of the table. Furthermore, in any of the second treatment liquids, the content of the pH adjusting agent was 2% by mass or less with respect to the total mass of the second treatment liquid.

In the second treatment liquid, the balance other than each component and the pH adjusting agent shown in the table is water.

TABLE 8

| Table 3 | Treatment liquid used in first-stage cleaning step | Formulation of second treatment liquid (water and pH adjusting agent not described) | | | | | | | Results | | |
|---|---|---|---|---|---|---|---|---|---|---|---|
| | | Chelating agent | | Specific nitrogen-containing compound and additive | | | | | Defects based on metal residue | Defects based on organic residue | Defects based on corrosion of metal film surface |
| | | Type | Amount (%) | Type | Amount (%) | Type | Amount (%) | pH | | | |
| Example 69 | Example 1 | Citric acid | 3 | Tris | 4.2 | Sorbic acid<br>L-Histidine | 0.05<br>1.5 | 6 | A | A | B |
| Example 70 | Example 1 | Citric acid | 3 | Tris | 4.2 | Sorbic acid<br>L-Arginine | 0.05<br>1.5 | 6 | A | A | B |
| Example 71 | Example 1 | Citric acid | 3 | Tris | 4.2 | Sorbic acid<br>L-Lysine | 0.05<br>1.5 | 6 | A | A | B |
| Example 72 | Example 1 | Citric acid | 3 | Tris | 4.75 | Sorbic acid<br>2-Aminopyrimidine | 0.05<br>2 | 6 | A | A | B |
| Example 73 | Example 1 | Citric acid | 3 | Tris | 4.75 | Sorbic acid<br>2,4-Diaminopyrimidine | 0.05<br>2 | 6 | A | A | B |
| Example 74 | Example 1 | Citric acid | 3 | Tris | 4.75 | Sorbic acid<br>2,4,6-Triaminopyrimidine | 0.05<br>2 | 6 | A | A | B |
| Example 75 | Example 1 | Citric acid | 3 | Tris | 4.75 | Sorbic acid<br>2,6-Dihydroxypyrimidine | 0.05<br>2 | 6 | A | A | B |
| Example 76 | Example 1 | Citric acid | 3 | Tris | 4.75 | Sorbic acid<br>Uracil | 0.05<br>2 | 6 | A | A | B |
| Example 77 | Example 1 | Citric acid | 3 | Tris | 4.75 | Sorbic acid<br>Cytosine | 0.05<br>2 | 6 | A | A | B |
| Example 78 | Example 1 | Citric acid | 3 | Tris | 4.2 | Sorbic acid<br>L-Arginine<br>YS-100 | 0.05<br>1.5<br>0.2 | 6 | A | A | A |
| Example 79 | Example 1 | Citric acid | 3 | Tris | 4.2 | Sorbic acid<br>L-Arginine<br>Aron-SD10 | 0.05<br>1.5<br>0.2 | 6 | A | A | A |

TABLE 8-continued

| Table 3 | Treatment liquid used in first-stage cleaning step | Formulation of second treatment liquid (water and pH adjusting agent not described) | | | | | | | Results | | |
|---|---|---|---|---|---|---|---|---|---|---|---|
| | | Chelating agent | | Specific nitrogen-containing compound and additive | | | | | Defects based on metal residue | Defects based on organic residue | Defects based on corrosion of metal film surface |
| | | Type | Amount (%) | Type | Amount (%) | Type | Amount (%) | pH | | | |
| Example 80 | Example 1 | Citric acid | 3 | Tris | 4.2 | Sorbic acid | 0.05 | 6 | A | A | A |
| | | | | | | L-Lysine | 1.5 | | | | |
| | | | | | | YS-100 | 0.2 | | | | |
| Example 81 | Example 1 | Citric acid | 3 | Tris | 4.2 | Sorbic acid | 0.05 | 6 | A | A | A |
| | | | | | | L-Lysine | 1.5 | | | | |
| | | | | | | Aron-SD10 | 0.2 | | | | |
| Example 82 | Example 1 | Citric acid | 3 | Tris | 4.85 | Sorbic acid | 0.05 | 6 | A | A | A |
| | | | | | | L-Lysine | 1.5 | | | | |
| | | | | | | Phthalic acid | 1.0 | | | | |
| Example 83 | Example 1 | Citric acid | 3 | Tris | 4.85 | Sorbic acid | 0.05 | 6 | A | A | A |
| | | | | | | L-Lysine | 1.5 | | | | |
| | | | | | | Trimellitic acid | 1.0 | | | | |
| Example 84 | Example 1 | Citric acid | 3 | Tris | 4.85 | Sorbic acid | 0.05 | 6 | A | A | A |
| | | | | | | L-Lysine | 1.5 | | | | |
| | | | | | | Pyromellitic acid | 1.0 | | | | |
| Example 85 | Example 1 | Citric acid | 3 | Tris | 4.85 | Sorbic acid | 0.05 | 6 | A | A | A |
| | | | | | | L-Lysine | 1.5 | | | | |
| | | | | | | Trimellitic acid | 0.5 | | | | |

TABLE 9

| Table 3 (Continued) | Treatment liquid used in first-stage cleaning step | Formulation of second treatment liquid (water and pH adjusting agent not described) | | | | | | | Results | | |
|---|---|---|---|---|---|---|---|---|---|---|---|
| | | Chelating agent | | Specific nitrogen-containing compound and additive | | | | | Defects based on metal residue | Defects based on organic residue | Defects based on corrosion of metal film surface |
| | | Type | Amount (%) | Type | Amount (%) | Type | Amount (%) | pH | | | |
| Example 86 | Example 1 | Citric acid | 3 | Tris | 5.15 | Sorbic acid | 0.05 | 6 | A | A | A |
| | | | | | | L-Lysine | 0.75 | | | | |
| | | | | | | Trimellitic acid | 1.0 | | | | |
| Example 87 | Example 1 | Citric acid | 3 | Tris | 4.65 | Sorbic acid | 0.05 | 6 | A | A | A |
| | | | | | | L-Lysine | 2 | | | | |
| | | | | | | Trimellitic acid | 0.5 | | | | |
| Example 88 | Example 1 | Citric acid | 3 | Tris | 4.85 | Sorbic acid | 0.05 | 6 | A | A | A |
| | | | | | | L-Arginine | 1.5 | | | | |
| | | | | | | Phthalic acid | 1.0 | | | | |
| Example 89 | Example 1 | Citric acid | 3 | Tris | 4.85 | Sorbic acid | 0.05 | 6 | A | A | A |
| | | | | | | L-Arginine | 1.5 | | | | |
| | | | | | | Trimellitic acid | 1.0 | | | | |
| Example 90 | Example 1 | Citric acid | 3 | Tris | 4.85 | Sorbic acid | 0.05 | 6 | A | A | A |
| | | | | | | L-Arginine | 1.5 | | | | |
| | | | | | | Pyromellitic acid | 1.0 | | | | |
| Example 91 | Example 1 | Citric acid | 3 | Tris | 4.85 | Sorbic acid | 0.05 | 6 | A | A | A |
| | | | | | | L-Arginine | 1.5 | | | | |
| | | | | | | Trimellitic acid | 0.5 | | | | |
| Example 92 | Example 1 | Citric acid | 3 | Tris | 5.15 | Sorbic acid | 0.05 | 6 | A | A | A |
| | | | | | | L-Arginine | 0.75 | | | | |
| | | | | | | Trimellitic acid | 1.0 | | | | |
| Example 93 | Example 1 | Citric acid | 3 | Tris | 4.65 | Sorbic acid | 0.05 | 6 | A | A | A |
| | | | | | | L-Arginine | 2 | | | | |
| | | | | | | Trimellitic acid | 0.5 | | | | |
| Example 94 | Example 1 | Citric acid | 3 | Tris | 4.2 | Sorbic acid | 0.05 | 6 | A | A | A |
| | | | | | | L-Histidine | 1.5 | | | | |
| | | | | | | YS-100 | 0.2 | | | | |
| Example 95 | Example 1 | Citric acid | 3 | Tris | 4.2 | Sorbic acid | 0.05 | 6 | A | A | A |
| | | | | | | L-Histidine | 1.5 | | | | |
| | | | | | | Aron-SD10 | 0.2 | | | | |
| Example 96 | Example 1 | Citric acid | 3 | Tris | 4.85 | Sorbic acid | 0.05 | 6 | A | A | A |
| | | | | | | L-Histidine | 1.5 | | | | |
| | | | | | | Phthalic acid | 1.0 | | | | |

TABLE 9-continued

| Table 3 (Continued) | Treatment liquid used in first-stage cleaning step | Formulation of second treatment liquid (water and pH adjusting agent not described): Chelating agent Type | Chelating agent Amount (%) | Specific nitrogen-containing compound and additive: Type | Amount (%) | Type | Amount (%) | pH | Results: Defects based on metal residue | Defects based on organic residue | Defects based on corrosion of metal film surface |
|---|---|---|---|---|---|---|---|---|---|---|---|
| Example 97 | Example 1 | Citric acid | 3 | Tris | 4.85 | Sorbic acid<br>L-Histidine<br>Trimellitic acid | 0.05<br>1.5<br>1.0 | 6 | A | A | A |
| Example 98 | Example 1 | Citric acid | 3 | Tris | 4.85 | Sorbic acid<br>L-Histidine<br>Pyromellitic acid | 0.05<br>1.5<br>1.0 | 6 | A | A | A |
| Example 99 | Example 1 | Citric acid | 3 | Tris | 4.85 | Sorbic acid<br>L-Histidine<br>Trimellitic acid | 0.05<br>1.5<br>0.5 | 6 | A | A | A |
| Example 100 | Example 1 | Citric acid | 3 | Tris | 5.15 | Sorbic acid<br>L-Histidine<br>Trimellitic acid | 0.05<br>0.75<br>1.0 | 6 | A | A | A |
| Example 101 | Example 1 | Citric acid | 3 | Tris | 4.65 | Sorbic acid<br>L-Histidine<br>Trimellitic acid | 0.05<br>2<br>0.5 | 6 | A | A | A |

From the results of Examples 69 to 101, it was confirmed that the treatment liquid produced by the production method of the embodiment of the present invention has good cleanability (defect inhibition property) in a case of being applied to a semiconductor substrate which had been subjected to a chemical mechanical polishing (CMP) treatment.

Above all, it has been confirmed that better cleanability can be realized by performing cleaning with the treatment liquid produced by the production method of the embodiment of the present invention, and cleaning with the second treatment liquid.

In addition, it was confirmed that in a case where the second treatment liquid includes two or more kinds of specific nitrogen-containing compounds and a polycarboxylic acid, even better cleanability can be realized (see the results of Examples 78 to 101, and the like).

EXPLANATION OF REFERENCES

40: filter
41: filter medium
42: core
43: cap
44: liquid outlet

What is claimed is:

1. A method for producing a treatment liquid, comprising:

performing filtration of an object to be purified including a surfactant, using a first filter having a first filter medium, to produce a treatment liquid for a semiconductor substrate, wherein the first filter medium includes at least one selected from the group consisting of a nylon, a polyallyl sulfonic acid, a perfluoroalkoxy alkane which has been subjected to a hydrophilization treatment, a polytetrafluoroethylene which has been subjected to a hydrophilization treatment, a polyolefin which has been subjected to a hydrophilization treatment, and a polyvinylidene fluoride which has been subjected to a hydrophilization treatment, the surfactant includes at least one selected from the group consisting of a nonionic surfactant including a group represented by Formula (1) and an anionic surfactant including a group represented by Formula (1), and the treatment liquid is a treatment liquid to be applied to a semiconductor substrate which has been subjected to a chemical mechanical polishing treatment, $$(LO)_n \quad \text{Formula (1)}$$

in Formula (1), L represents an alkylene group, and n represents 3 to 55.

2. The method for producing a treatment liquid according to claim 1, wherein the object to be purified further includes an amine compound.

3. The method for producing a treatment liquid according to claim 2, wherein a mass ratio of a content of the amine compound to a content of the surfactant in the object to be purified is 2 to 1,000.

4. The method for producing a treatment liquid according to claim 2, wherein the object to be purified further includes an amine compound.

5. The method for producing a treatment liquid according to claim 4, wherein a mass ratio of a content of the amine compound to a content of the surfactant in the object to be purified is 2 to 1,000.

6. The method for producing a treatment liquid according to claim 2, wherein the nonionic surfactant and the anionic surfactant include a group represented by Formula (2), $$\text{-Ph-O-(LO)n-} \quad \text{Formula (2)}$$

in Formula (2), Ph represents a phenylene group, L represents an alkylene group, and n represents 3 to 55.

7. The method for producing a treatment liquid according to claim 2, wherein in Formula (1), n represents 6 to 20.

8. The method for producing a treatment liquid according to claim 2, wherein the object to be purified includes an aliphatic carboxylic acid-based chelating agent having 3 or more carbon atoms.

9. The method for producing a treatment liquid according to claim 1, wherein the nonionic surfactant and the anionic surfactant include a group represented by Formula (2), $$-Ph\text{-}O\text{-}(LO)_n\text{-} \quad \text{Formula (2)}$$

in Formula (2), Ph represents a phenylene group, L represents an alkylene group, and n represents 3 to 55.

10. The method for producing a treatment liquid according to claim 1, wherein in Formula (1), n represents 6 to 20.

11. The method for producing a treatment liquid according to claim 1, wherein the object to be purified includes an aliphatic carboxylic acid-based chelating agent having 3 or more carbon atoms.

12. The method for producing a treatment liquid according to claim 1, wherein a pH of the object to be purified is 8 to 12.

13. The method for producing a treatment liquid according to claim 1, wherein the first filter medium is at least one selected from the group consisting of the nylon, the polyallyl sulfonic acid, the perfluoroalkoxy alkane which has been subjected to a hydrophilization treatment, and the polytetrafluoroethylene which has been subjected to a hydrophilization treatment.

14. The method for producing a treatment liquid according to claim 1, wherein the first filter medium includes the polyallyl sulfonic acid.

15. The method for producing a treatment liquid according to claim 1, wherein the filtration of the object to be purified is performed using the first filter and a second filter including a second filter medium, which is different from the first filter.

16. The method for producing a treatment liquid according to claim 15, wherein a pore diameter of the second filter medium is larger than a pore diameter of the first filter medium, and the object to be purified is passed through the second filter and the first filter in this order to perform the filtration of the object to be purified.

17. The method for producing a treatment liquid according to claim 16, wherein a ratio of the pore diameter of the second filter medium to the pore diameter of the first filter medium is 2 to 500.

18. The method for producing a treatment liquid according to claim 1, wherein a filtration pressure for the filtration of the object to be purified, which is performed using the first filter, is 0.4 MPa or less.

19. The method for producing a treatment liquid according to claim 1, wherein a filtration pressure for the filtration of the object to be purified, which is performed using the first filter, is 0.05 MPa or more.

20. The method for producing a treatment liquid according to claim 1, wherein the first filter medium includes at least one selected from the group consisting of a polyallyl sulfonic acid, and a perfluoroalkoxy alkane which has been subjected to a hydrophilization treatment.

* * * * *